(12) United States Patent
Ajayan et al.

(10) Patent No.: US 7,189,430 B2
(45) Date of Patent: Mar. 13, 2007

(54) DIRECTED ASSEMBLY OF HIGHLY-ORGANIZED CARBON NANOTUBE ARCHITECTURES

(75) Inventors: Pulickel M. Ajayan, Clifton Park, NY (US); Ramanath Ganapathiraman, Clifton Park, NY (US); Anyuan Cao, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 127 days.

(21) Appl. No.: 10/361,640

(22) Filed: Feb. 11, 2003

(65) Prior Publication Data

US 2003/0165418 A1    Sep. 4, 2003

Related U.S. Application Data

(60) Provisional application No. 60/385,393, filed on Jun. 3, 2002, provisional application No. 60/356,069, filed on Feb. 11, 2002.

(51) Int. Cl.
*C23C 16/00* (2006.01)
*B05D 5/00* (2006.01)
*B05D 1/32* (2006.01)

(52) U.S. Cl. .............. 427/249.1; 427/180; 427/255.11; 427/255.23; 427/255.28; 427/259; 427/282

(58) Field of Classification Search .................. 427/78, 427/180, 200, 206, 249.1, 255.11, 255.23, 427/255.28, 259, 261, 282, 903; 423/445 B, 423/447.1, 447.2, 447.3
See application file for complete search history.

(56) References Cited

U.S. PATENT DOCUMENTS 5,863,601 A * 1/1999 Kikuchi et al. ............. 427/200
6,062,931 A   5/2000 Chuang et al.
6,283,812 B1  9/2001 Jin et al.
6,340,822 B1  1/2002 Brown et al.
6,346,189 B1* 2/2002 Dai et al. ................... 205/766
6,445,006 B1* 9/2002 Brandes et al. ............... 257/76
6,515,339 B2* 2/2003 Shin et al. ................... 257/368
6,628,053 B1* 9/2003 Den et al. .................... 313/310
6,689,674 B2* 2/2004 Zhang et al. ............... 438/584
6,803,840 B2* 10/2004 Hunt et al. ................. 333/186
6,882,098 B2* 4/2005 Choi et al. .................. 313/495

(Continued)

FOREIGN PATENT DOCUMENTS

KR    2002-003782    * 1/2002

(Continued)

OTHER PUBLICATIONS

Andrews et al., "Continuous production of aligned carbon nanotubes: a step closer to commercial realization", Chem. Phys. Lett., 303, Apr. 16, 1999, pp. 467-474.*

(Continued)

*Primary Examiner*—Timothy Meeks
*Assistant Examiner*—Kelly Stouffer
(74) *Attorney, Agent, or Firm*—Foley & Lardner LLP

(57) ABSTRACT

A method of controllably aligning carbon nanotubes to a template structure to fabricate a variety of carbon nanotube containing structures and devices having desired characteristics is provided. The method allows simultaneous, selective growth of both vertically and horizontally controllably aligned nanotubes on the template structure but not on a substrate in a single process step.

24 Claims, 15 Drawing Sheets

U.S. PATENT DOCUMENTS

| | | | |
|---|---|---|---|
| 2001/0004979 A1 | 6/2001 | Han et al. | |
| 2002/0025374 A1* | 2/2002 | Lee et al. | 427/230 |
| 2003/0108479 A1* | 6/2003 | Baker et al. | 423/447.3 |
| 2004/0043148 A1* | 3/2004 | Wei et al. | 427/249.1 |
| 2004/0232426 A1* | 11/2004 | Graham et al. | 257/77 |

FOREIGN PATENT DOCUMENTS

| | | | |
|---|---|---|---|
| KR | 2002-093270 A | * | 12/2002 |

OTHER PUBLICATIONS

Grapevine-like growth of single walled carbon nanotubes among vertically aligned multiwalled nanotube arrays, Anyuan Cao, et al., Applied Physics Letters, vol. 79, No. 9, Aug. 27, 2001.

Growing pillars of densely packed carbon nanotubes on Ni-coated silica, B.Q. Wei, et al., Carbon 40 (2002) 47-51.

Controlling growth of carbon microtrees, Yung Joon Jung, et al., Carbon 39 (2001) 2195-2201.

Substrate-interface interactions between carbon nanotubes and the supporting substrate, R. Czerw, et al., Physical Review B 66, 033408 (2002).

Lift-up growth of aligned carbon nanotube patterns, Bingqing Wei, et al., Applied Physics Letters, vol. 77, No. 19, Nov. 6, 2000.

Applications of Carbon Nanotubes, Pulickel M. Ajayan, et al., Topics Appl. Phys. 80, 391-425 (2001).

Substrate-site selective growth of aligned carbon nanotubes, Z.J. Zhang, et al., Applied Physics Letters, vol. 77, No. 23, Dec. 4, 2000.

Organized assembly of carbon nanotubes, B.Q. Wei, et al., Nature, vol. 416, Apr. 4, 2002.

Carbon nanotube network growth of palladium seeds, R. Vajtai, et al., Materials Science and Engineering C 19 (2002) 271-274.

Building carbon nanotubes and their smart architectures, R. Vajtai, et al., Institute of Physics Publishing, Smart Mater. Struct. 11 (2002) 691-698.

Surface and Interface Control of Polymeric Biomaterials, Conjugated Polymers, and Carbon Nanotubes, Liming Dai, et al, J. Phys. Chem. B 2000, 104, 1891-1915.

Controlled production of aligned-nanotube bundles, M. Terrones, et al, Nature, vol. 388, Jul. 3, 1997.

Large Scale Synthesis of Aligned Carbon Nanotubes, W.Z. Li, et al, Science 1996.

Synthesis of Large Arrays of Well-Aligned Carbon Nanotubes on Glass, Z.F. Ren, Science, vol. 282, Nov. 6, 1988.

Self-Oriented Regular Arrays of Carbon Nanotubes and Their Field Emission Properties, Shoushan Fan, et al., Science, vol. 283, Jan. 22, 1999.

Carbon Nanotube-Based Nonvolatile Random Access Memory for Molecular Computing, Thomas Rueckes, et al., Science, vol. 289, Jul. 7, 2000.

Single Crystals of Single-Walled Carbon Nanotubes Formed by Self-Assembly, R.R. Schlitter, et al., Science, vol. 292, May 11, 2001.

Preparation and Properties of Polymer-Wrapped Single-Walled Carbon Nanotubes, Alexander Star, et al., Angew. Chem. Int. Ed. 2001, 40, No. 9.

Controlled Adsorption of Carbon Nanotubes on Chemically Modified Electrode Arrays, Adv. Mater. 1998, 10, No. 8.

Patterned Films of Nanotubes Using Microcontact Printing of Catalysts, Adv. Mater. 1999, 11, No. 15.

An Enhanced CVD Approach to Extensive Nanotube Networks with Directionality, Adv. Mater. 2000, 12, No. 12.

Integration of suspended carbon nanotube arrays into electronic devices and electromechanical systems, Nathan R. Franklin, et al., Applied Physics Letters, vol. 81, No. 5, Jul. 29, 2002.

Growth of suspended carbon nanotube networks on 100-nm-scale silicon pillars, Applied Physics Letters, vol. 81, No. 12.

Directed placement of suspended carbon nanotubes for nanometer-scale assembly, Larry A. Nagahara, et al, Applied Physics Letters, vol. 80, No. 20, May 20, 2002.

Electri-field-aligned growth of single-walled carbon nanotubes on surfaces, Ant Ural, et al., Applied Physics Letters, vol. 81, No. 18, Oct. 28, 2002.

Carbon Nanotubes by the metallocene route, Rahul Sen, et al, Chemical Physics Letters 267 (1997) 276-280.

Xianfeng Zhang et al., Rapid Growth of Well-Aligned Carbon Nanotube Arrays, Chemical Physics Letters 362, Aug. 19, 2002, pp. 285-290.

B. Q. Wei et al., Assembly of Highly Organized Carbon Nanotube Architectures of Chemical Vapor Deposition, Chem. Mater., vol. 15, No. 8, 2003, pp. 1598-1606.

B. Q. Wei et al., Organized Assembly of Carbon Nanotubes, Nature, vol. 416, Apr. 4, 2002, pp. 495-496.

Controlled Chemical Routes to Nanotube Architectures, Physics, and Devices, Dai, et al, J. Phys. Chem. B 1999, 103, 11246-11255.

* cited by examiner

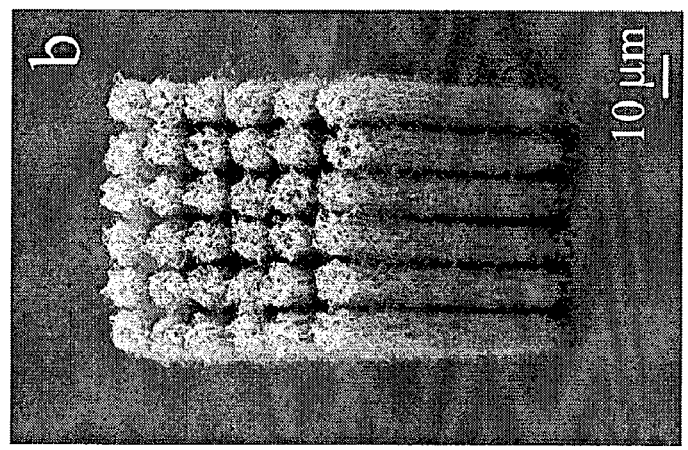
FIGURE 1A
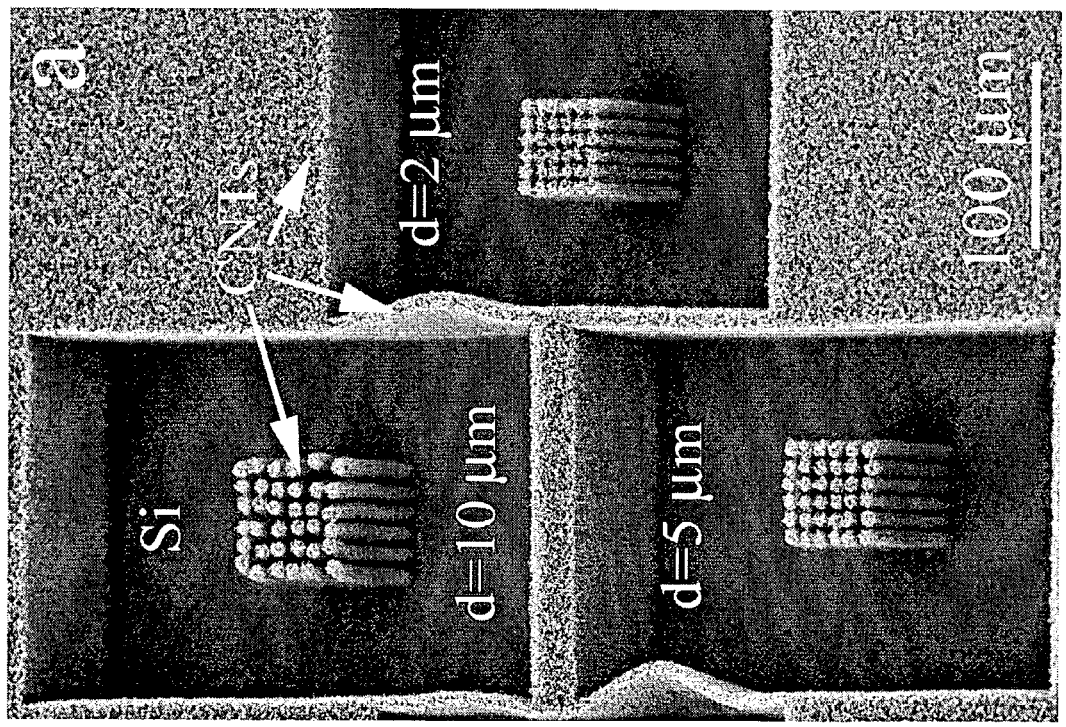
FIGURE 1B
FIGURE 1C
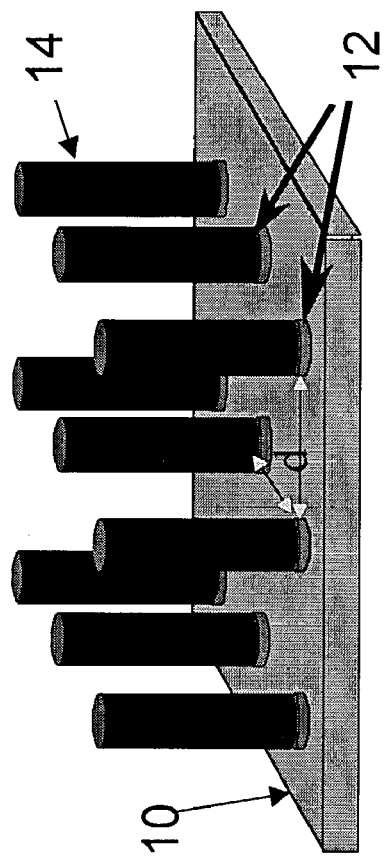

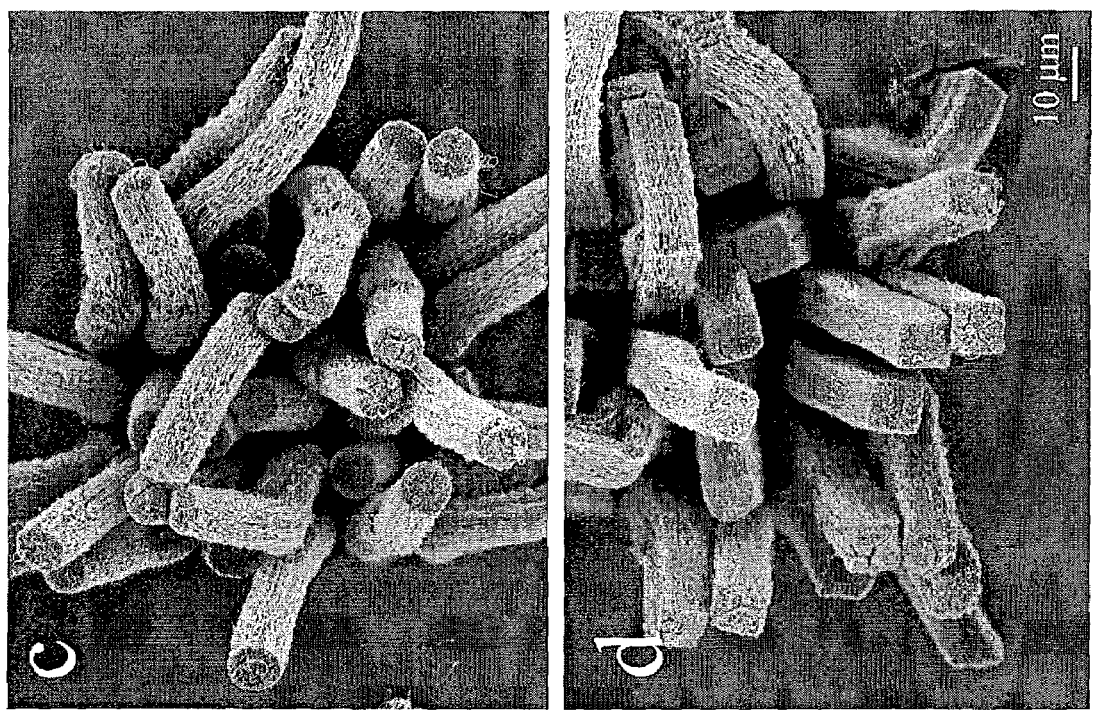
FIGURE 2C
FIGURE 2D
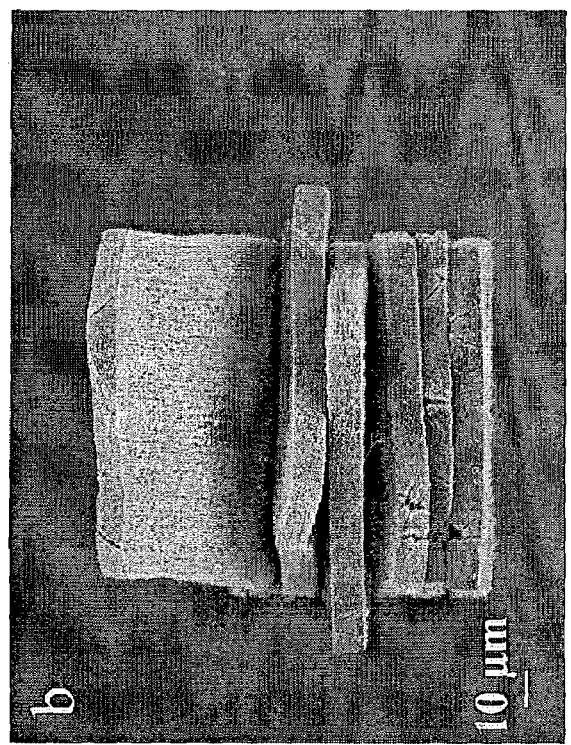
FIGURE 2B

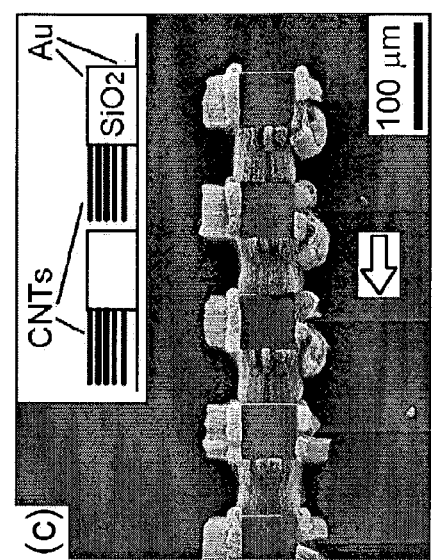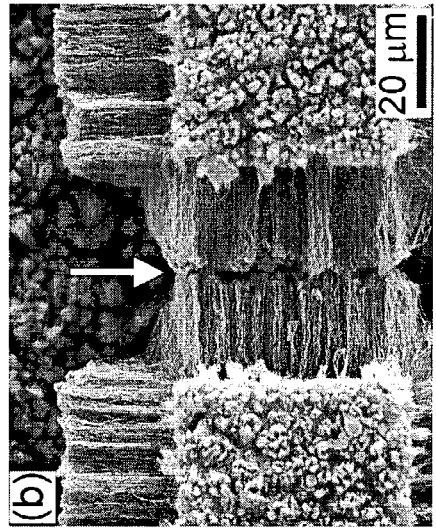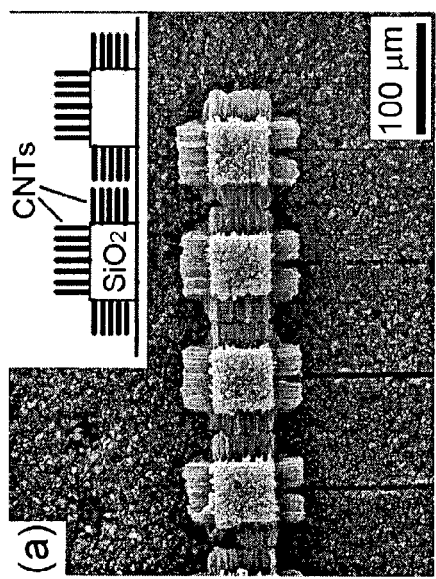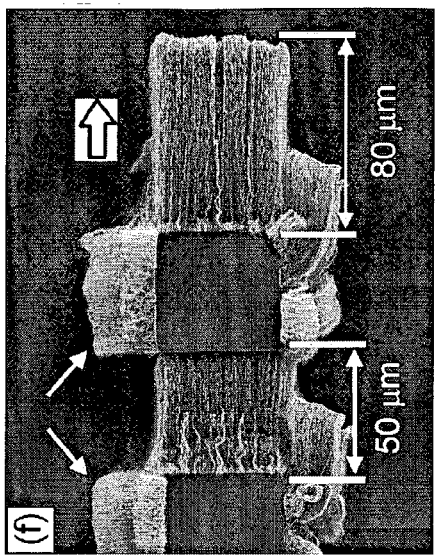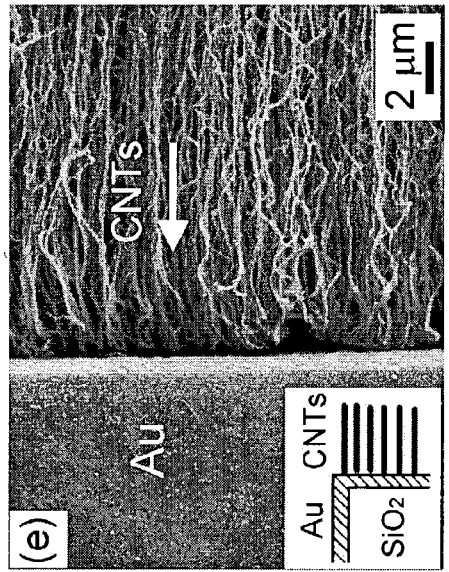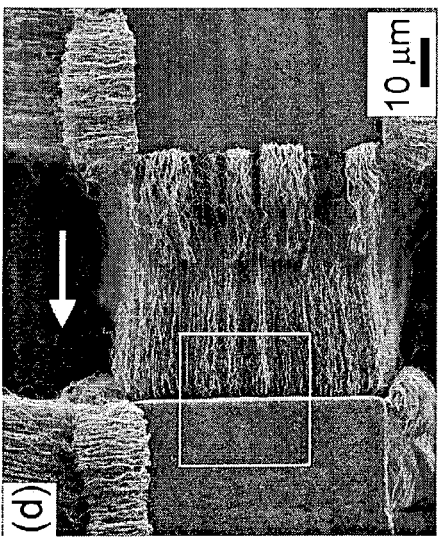
FIGURE 8A FIGURE 8B FIGURE 8C
FIGURE 8D FIGURE 8E FIGURE 8F

DIRECTED ASSEMBLY OF HIGHLY-ORGANIZED CARBON NANOTUBE ARCHITECTURES

CROSS-REFERENCE TO RELATED PATENT APPLICATIONS

The present application claims benefit under 35 U.S.C. §119(e) of U.S. provisional applications 60/356,069, filed Feb. 11, 2002 and 60/385,393, filed Jun. 3, 2002, both of which are incorporated herein by reference in their entirety.

STATEMENT REGARDING FEDERALLY SPONSORED RESEARCH OR DEVELOPMENT

The U.S. Government may have certain rights in this invention pursuant to grant number N00014-00-1-2050 from the Office of Naval Research.

BACKGROUND OF THE INVENTION

The present invention relates generally to carbon nanotubes and more particularly to selective growth of carbon nanotubes on template materials.

It is likely that future devices containing organized structures of various functional materials with new properties will be built from nanoscale building blocks. These nanoscale building blocks can be produced by a variety of synthesis routes. The novel properties of the nanoscale building blocks arising from their low dimensions are known for a wide range of materials.

Carbon nanotubes are a nanostructured material which promises to have a wide range of applications. However, the present techniques used to controllably build organized architectures of nanotubes with predetermined orientations have several deficiencies. For example, vertically aligned nanotubes has been fabricated on catalyst printed planar substrates by chemical vapor deposition. See, for example, W. Z. Li, et al. Science 274, 1701 (1996); R. Sen, A. Govindaraj, C. N. R. Rao, Chem. Phys. Lett. 267, 276 (1997); M. Terrones, et al. Nature 388, 52 (1997); Z. F. Ren, et al. Science 282, 1105 (1998); S. S. Fan, et al. Science 283, 512 (1999); H. Kind, et al. Adv. Mater. 11, 1285 (1999); R. R. Schlittler, et al. Science 292, 1136 (2001) and L. Dai, A. W. H. Mau, J. Phys. Chem. B 104, 1891 (2000). However, this technique requires deposition and patterning, usually in separate processing steps, of catalyst material, typically in nanoparticle assemblies or thin film forms, which complicates the nanotube fabrication method. This also does not allow growth of nanotubes in more than one preselected orientation at different locations in a controllable fashion.

While growth of vertically aligned nanotubes on planar substrates by CVD has been reported extensively, obtaining nanotubes that are exclusively oriented parallel to the substrate in predetermined orientations has been more difficult. Suspended nanotubes across elevated structures have been produced recently by several different methods. One method involves adjusting the gas flow during CVD. See N. R. Franklin, H. Dai, Adv. Mater. 2000, 12, 890; N. R. Franklin, Q. Wang, T. W. Tombler, A. Javey, M. Shim, H. Dai, Appl. Phys. Lett. 2002, 81, 913; and Y. Homma, Y. Kobayashi, T. Ogino, T. Yamashita, Appl. Phys. Lett. 2002, 81, 2261. Another method involves applying an electrical field during CVD. See Y. Zhang, A. Chang, J. Cao, Q. Wang, W. Kim, Y. Li, N. Morris, E. Yenilmez, J. Kong, H. Dai, Appl. Phys. Lett. 2001, 79, 3155; and A. Ural, Y. Li, H. Dai, Appl. Phys. Lett. 2002, 81, 3464. However, these approaches require pre-deposition and pre-patterning of nanoscale catalyst particle assemblies. Also, the probability of nanotubes bridging across different catalyst islands is difficult to predict and control. Several articles also note that nanotubes can be aligned in horizontal configurations through electric fields or microfluidic forces. See A. Star, et al., Angewandte Chem. International Edition 40, 1721 (2001) and T. Rueckes, et al., Science 289, 94 (2000). However, these methods are also complicated, and are difficult to scale (e.g., create them reproducibly on an 8 inch Si wafer) and to control, for developing devices for applications. Moreover, in these cases the nanotubes are not rooted to the substrate (i.e. they are just lying on them, and hence not very robust).

Several methods have also been suggested for controlled placement of carbon nanotubes onto electrode pairs, including AC bias-enhanced deposition and chemically modified adsorption. See L. A. Nagahara, I. Amiani, J. Lewenstein, R. K. Tsui, Appl. Phys. Lett. 2002, 80, 3826 and M. Burgard, G. Buesberg, G. Philipp, J. Muster, S. Roth, Adv. Mater. 1998, 10, 584.

Some of the present inventors have also previously suggested to selectively grow carbon nanotubes on silica templates located on a silicon substrate without growing the nanotubes on the silicon substrate. See Z. J. Zhang, B. Q. Wei, G. Ramanath, P. M. Ajayan, Appl. Phys. Lett. 77, 3764 (2000). The use of this template structure is advantageous in that it does not require the deposition and patterning of the catalyst material. However, as can be seen in FIG. 4 of the Z. J. Zhang et al. article, while roughly vertical and horizontal nanotubes were simultaneously grown on the template structures, it was not possible to controllably align nanotubes during growth in a direction perpendicular to the silica template structure surfaces. For example, as shown in the insert in FIG. 4 of this article, the nanotubes were not aligned precisely and controllably.

SUMMARY OF THE INVENTION

A preferred embodiment of the invention provides a method of making carbon nanotubes, comprising providing a substrate containing a template structure having at least two surfaces and providing a nanotube source gas onto the template structure. The nanotube source gas preferably comprises a mixture of nanotube forming precursor gas, such as xylenes, and a catalyst gas, such as ferrocene. However, other suitable gases or a single source gas may be used instead. The method further provides for selectively and simultaneously growing the carbon nanotubes on the at least two surfaces of the template structure but not on exposed portions of the substrate (i.e., in exclusion to the substrate material which supports the template structure). The grown carbon nanotubes are controllably aligned in a direction perpendicular to the respective surfaces of the template structure.

Another preferred embodiment of the invention provides a structure, comprising a substrate and a template structure located on the substrate, wherein the template structure comprises at least two surfaces. The structure also comprises a first plurality of carbon nanotubes disposed on a first surface of the template structure, wherein the first plurality of carbon nanotubes are controllably aligned in a first direction perpendicular to the first surface of the template structure, and a second plurality of carbon nanotubes disposed on a second surface of the template structure, wherein the second plurality of carbon nanotubes are controllably aligned in a second direction perpendicular to the second surface of the template structure, such that the first direction is different than the second direction.

BRIEF DESCRIPTION OF THE DRAWINGS

FIGS. 1A–B, 2A–D, 4A–C, 5, 6A–G, 8A–F, 9C, 11A–B and 12C are SEM images of carbon nanotube structures according to preferred embodiments of the present invention.

FIGS. 1C, 4D, 6H, 11C and 12A–B are three dimensional schematics of carbon nanotube structures according to preferred embodiments of the present invention. The distance between the nanotubes in FIG. 1C is shown by the arrows marked "d".

DETAILED DESCRIPTION OF THE PREFERRED EMBODIMENTS

Figure 2A:
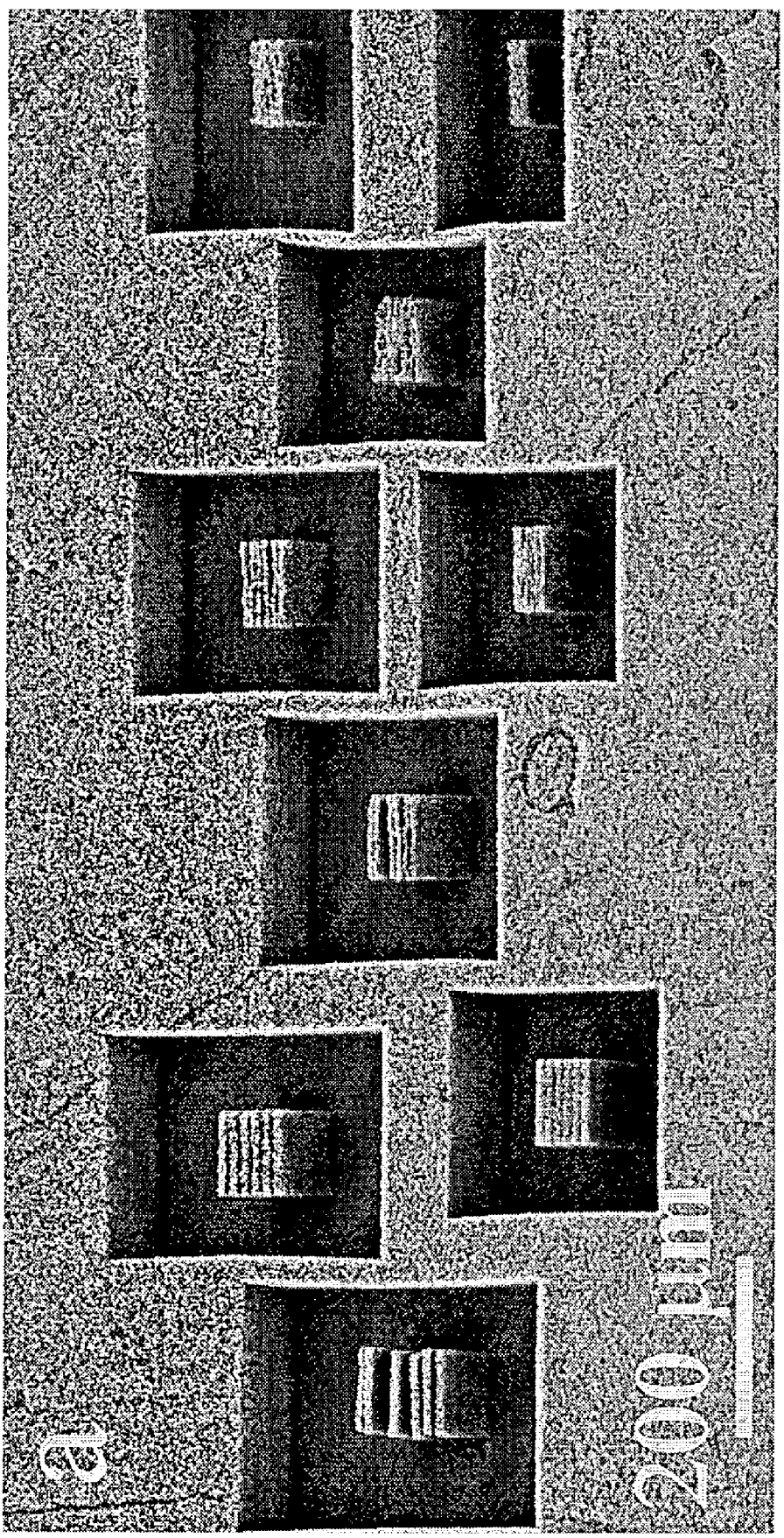

The present inventors have developed a method of controllably aligning carbon nanotubes to a template structure to fabricate a variety of carbon nanotube containing structures and devices having desired characteristics. For example, by selecting a template structure with a sufficient thickness allows a simultaneous growth of both vertically and horizontally controllably aligned nanotubes in a single process step. In fact, the nanotubes may be aligned in any set of in-plane and/or out of plane orientations and grown in a single process step. The level of control provided by this method provides construction of complex, nanotube based, highly organized 1-to-3-D architectures for building or use in nanotube based devices and systems in a scalable fashion.

A template structure, pattern or material is a structure, pattern or material which allows selective growth of carbon nanotubes on it without growing any detectable amount of carbon nanotubes on exposed portions of the substrate which supports the template. Nanotubes grow normal to, and selectively on the template structure, inheriting the topography of the template structure. Thus, the nanotubes are controllably aligned in a direction perpendicular to the surface of the template structure from which they grow such that all the nanotubes which grow from a particular template structure surface are oriented in the same direction. The precise control of nanotube orientation allows the fabrication of a wide variety of organized architectures of differing complexities, shapes, densities, dimensions and orientation. The bottom up fabrication approach is easy, scalable, and compatible with silicon microfabrication techniques and processes.

In a preferred aspect of the present invention, the template structure comprises a silicon dioxide structure located on a silicon substrate. However, other suitable template and substrate materials may be used instead. For example, other silicon oxide and metal oxide template structures materials, such as silicon oxynitride, magnesium oxide, aluminum oxide or indium tin oxide, may be used instead. Thus, a carbon nanotube growth catalyst material, such as a metal nanoparticle layer, is not necessary to selectively grow carbon nanotubes, and is preferably omitted to simplify processing. In alternative aspects of the present invention, a metal that does not catalyze nanotube growth, such as gold or copper, can also be used to mask part of the template structure material on the substrate. The substrate material can be any material that does not catalyze nanotube growth. Examples of preferred substrate materials are a single crystal silicon wafer, epitaxial silicon and polysilicon layers. Furthermore, other semiconductor materials, such as II–VI and III–V semiconductor materials, and non-semiconductor materials, such as ceramics, metals, glasses and plastics that do not catalyze nanotube growth may be used as a substrate by appropriately selecting the template material which allows selective growth of carbon nanotubes.

In another alternative aspect of the present invention, the substrate may be omitted entirely, and the nanotubes may be fabricated on free standing template structures. For example carbon nanotubes may be formed on the surfaces of oxide particles, such as silica, alumina, MgO and other silicon and metal oxide particles. Preferably, the particles are substantially spherical oxide particles, such as spherical, oval and roughly spherical (i.e., spherical particles with chiseled surfaces) particles. The particles may be micro sized (preferably 1 to 1,000 micron diameter) or macro sized (preferably 1,000 microns to 1 cm diameter). The carbon nanotubes are aligned perpendicular to the oxide particle surfaces.

In preferred embodiments of the present invention, controllably aligned multiwalled carbon nanotubes are selectively and simultaneously grown in patterns and in multiple directions on lithographically patterned silica templates in a single process. This process is preferably carried out through a CVD method that delivers the nanotube-forming precursor and the catalyst material (in compound or elemental form) from the gas phase either simultaneously or sequentially.

The specific examples of nanotube structures of the present invention shown are illustrated in SEM images in the Figures. However, the present invention should not be considered limited by the structures and methods of the specific examples, which are provided for illustration of the present invention.

The nanotube structures shown in the SEM images in the Figures were selectively grown on non-planar patterns composed of $SiO_2$ and Si surfaces. The substrates were Si (100) wafers capped with thermally grown or plasma-enhanced chemical vapor deposition (PECVD) deposited $SiO_2$ template structures having a thickness of 100 nm to several microns, such as 2 to 8.5 microns. For example, thick silica layers (up to about 8.5 microns) were deposited by PECVD to create high-aspect-ratio silica features. Patterns of $Si/SiO_2$ of various shapes were generated by photolithography followed by a combination of wet and/or dry etching.

Patterned nanotube growth was achieved without metal catalyst predeposition and patterning, thereby simplifying the template preparation by eliminating 2 processing steps. Instead, CVD nanotube growth was stimulated by exposing the substrate and the template structure on the substrate to vapor mixtures comprising xylenes ($C_8H_{10}$), a nanotube-forming precursor, and ferrocene (Fe$(C_5H_5)_2$), a nanotube catalyst, at about 600 to 1100° C., preferably at about 800 to 900° C. However, other suitable source gases and temperatures may be used instead. Ferrocene was dissolved in xylenes (which preferably contains different isomers) at concentrations of about 0.01 g/ml, the mixture was preheated, co-evaporated and fed into the CVD chamber. Ferrocene preferably comprises 0.001 to 1 percent of the ferrocene/xylenes mixture. Prolonged growth in the temperature range of 600–1100° C., produced films of densely packed multiwalled carbon nanotubes on the template structures but not on the substrate. Uniform, vertically aligned nanotube films having a thickness of a few microns to several tens of microns were produced in few minutes at growth rates of about 10 microns/minute. The nanotubes in the nanotube films were about 30 nm diameter multiwalled carbon nanotubes. No nanotube growth was observed on pristine Si surfaces, or on the native oxide layer formed on the silicon substrate. Aligned nanotubes grew readily on $SiO_2$ templates in a direction normal to the template growth surface, and the selectivity was retained down to micron size $SiO_2$ templates.

Using the substrate-selective and normal direction growth process, the nanotubes structures of various shapes and orientations with respect to the Si surface were fabricated on active $SiO_2$ template surfaces. Thus, carbon nanotubes were selectively grown in desired patterns and architectures without further photolithographic patterning.

The method and structure of the first preferred embodiment will now be described. In the first preferred embodiment, the carbon nanotubes were selectively grown in one direction on various template structure shapes to produce various nanotube structure shapes having the footprint of the template surfaces. These nanotube structures can then be optionally removed from over the substrate and placed into a suitable device.

FIGS. 1A–B show a striking example of aligned nanotube pillars placed on specific sites on the substrate according to one aspect of the first embodiment. FIG. 1A illustrates an SEM image of pillars of aligned carbon nanotube (CNT) arrays within trenches surrounded by a thick aligned nanotube film grown vertically on the $SiO_2$ pattern on a Si substrate. The nanotube film was selectively grown on a $SiO_2$ pattern or template structure. In the center of box-like regions defined by the nanotube film walls, micro-sized cylindrical blocks or pillars of vertically oriented nanotubes are grown from the underlying template structure constituted by $SiO_2$ patterns in this case. Within each block, the nanotubes are highly oriented and densely packed. Three different pillar packing densities are shown in FIG. 1A, where the separation between pillars in each group is 10 microns (top), 5 microns (bottom) and 2 microns (center).

FIG. 1B is an enlarged image of the middle array shown in FIG. 1A showing the alignment of the nanotubes in each of the pillars. FIG. 1C illustrates a schematic of the nanotube pillars on the $SiO_2$ patterns located a Si substrate. Specifically, FIG. 1C shows a silicon substrate 10 containing cylindrical $SiO_2$ template structures 12 on the upper surface of the substrate 10. Carbon nanotube pillars 14 are selectively grown and are located on the upper surfaces of the template structures 12. Since the height (i.e., thickness) of the template structures 12 is less than a cutoff thickness for growth of nanotubes (such as less than 1 micron, preferably 200 nm or less), the nanotubes do not grow from the sidewalls of the template structures 12. The cutoff thickness varies with the template material and with the nanotube growth parameters.

The structures shown in FIGS. 1A–C were made by the following method. The $SiO_2$ template structures or patterns 12 were formed on a silicon substrate 10 by conventional photolithography. The template structures 12 were exposed to xylenes/ferrocene gas mixtures at temperatures ranging from 600 to 1100° C., preferably 800 to 900° C. in a CVD tube furnace. The nanotubes 14 grew extremely selectively on the $SiO_2$ patterns 12, but did not grow on the silicon substrate 10, leaving the exposed silicon substrate blank. Alignment of nanotubes can be easily identified from the sidewalls, which separate the micro pillar arrays of nanotubes. The template structures had a diameter of about 10 microns to form cylindrical nanotube pillars having a diameter of about 10 microns in diameter and separations between individual pillars 14 of 10, 5 and 2 microns for the top, bottom and middle pillar sets, respectively. In addition to the cylindrical pillars 14 and cylindrical template structures 12, other suitable pillar 14 shapes, such as polygonal (triangular, rectangular, trapezoidal, etc.), oval or irregular shapes, can be fabricated by shaping the template structures 12 accordingly. Furthermore, while $SiO_2$ template structures 12 on a silicon 10 substrate were illustrated, other suitable materials for the template structures 12 and the substrate 10 may be used instead, as described herein.

FIG. 2A is top view of several "sandwich" or rectangular block structures of platelets of aligned nanotubes grown from parallel silica lines (i.e., template structures) on a silicon substrate according to another preferred aspect of the first embodiment. The different sandwich structures show different nanotube platelet thickness (2–10 microns, decreasing from left to right in FIG. 2A) and separation between the platelets (2–10 microns, decreasing from left to right). The $SiO_2$ line patterns or template structures were each 100 microns in length. They were fabricated using standard photolithography. The nanotube platelets or lines were selectively grown on the template structures by the CVD method described above. The result shows the excellent control of the placement of the nanotube platelet structures at the desired locations, their thickness, height and the separation between them (density). The height of these structures can be precisely controlled to within a few tenths of microns to several hundreds of microns by tuning the nanotube deposition time. Of course shapes other than rectangular platelets, template materials other than $SiO_2$ and substrate materials other than silicon may be used instead.

FIG. 2B is a higher magnification SEM image showing the alignment of nanotubes within the nanotube platelets. The coordinated deformation and displacement of the individual platelets on the substrate indicate substantial attractive forces between individual nanotubes, suggesting that each platelet may be manipulated individually.

FIGS. 2C and 2D illustrate very long, ordered micro fibers of aligned nanotubes grown from silica patterns of two different shapes, resulting in two different fiber cross-sections, according to another aspect of the first embodiment. FIG. 2C shows fibers with a circular cross section and FIG. 2D shows fibers with a square cross section. Thus, the cross-sections of these nanotube fibers are controlled by the shape of the underlying template patterns on which they grow. Plural nanotubes within each micro-fiber can grow simultaneously to hundreds of micrometers, aligned all along the length. The template structures or patterns 12 used to produce these fibers are essentially the same as those used for structures in FIGS. 1A–C, but the growth time is longer resulting in flexible ordered fibers, compared to stiffer, shorter pillars of FIGS. 1A–C. The fibers can have a length of 100 to 500 microns, such as 150 to 300 microns, depending on the length of the nanotube deposition time.

In all cases of the nanotube pillars shown in FIGS. 1A–C, the nanotube platelets shown in FIGS. 2A–B and the nanotube fibers shown in FIGS. 2C–D, the present inventors observed good adhesion between individual nanotubes within each geometrical block, and between the nanotubes and the substrate. The nanotube blocks, however, can be detached from the substrates by ultrasonic agitation, and can be manipulated individually using any suitable nanotube manipulation method. For example, the removed nanotube pillars, platelets and/or fibers may be selectively placed into a desired device, such as an electronic device.

Figure 3C:
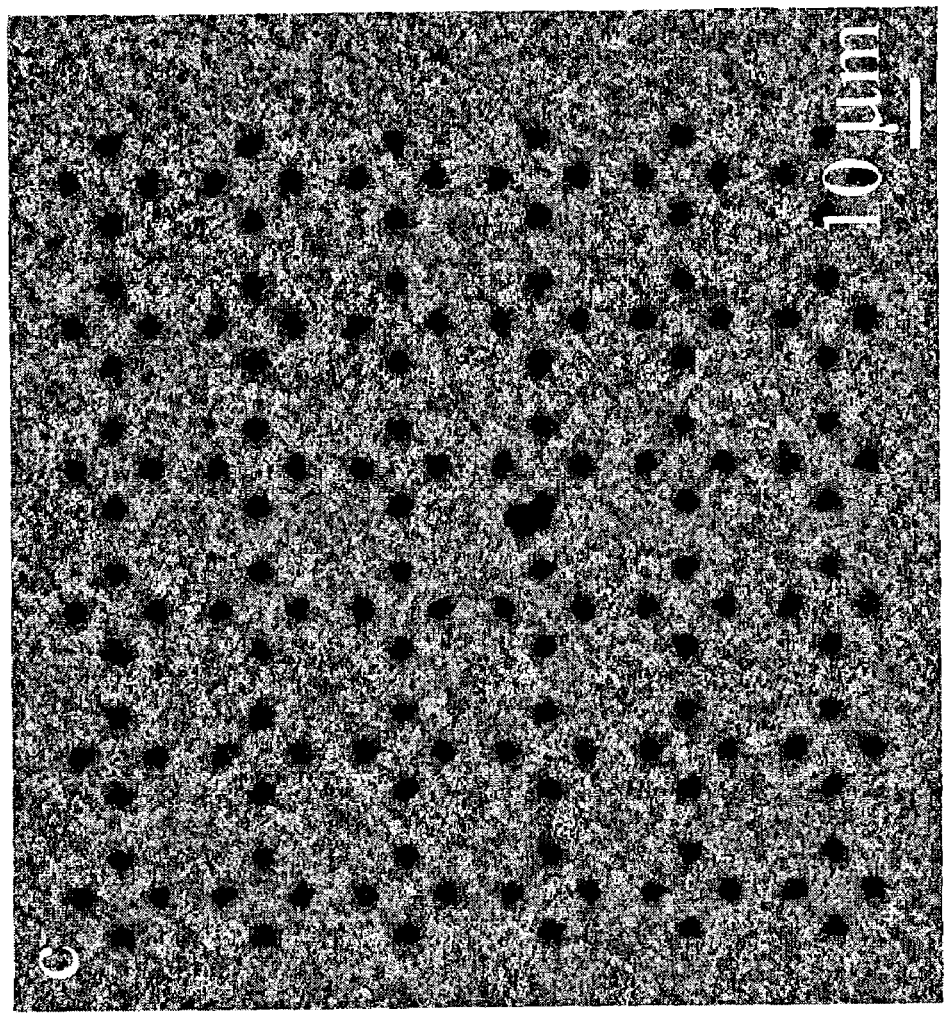
FIGS. 3A–3C are SEM images of porous carbon nanotube films according to a preferred embodiment of the present invention.
Figure 3A:
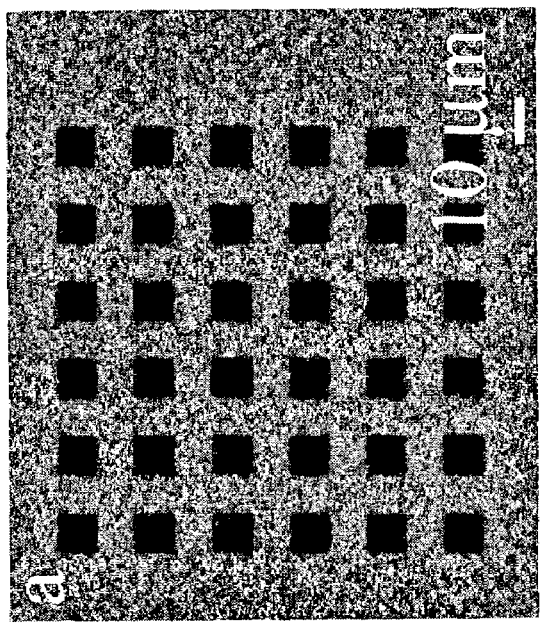
Figure 3B:
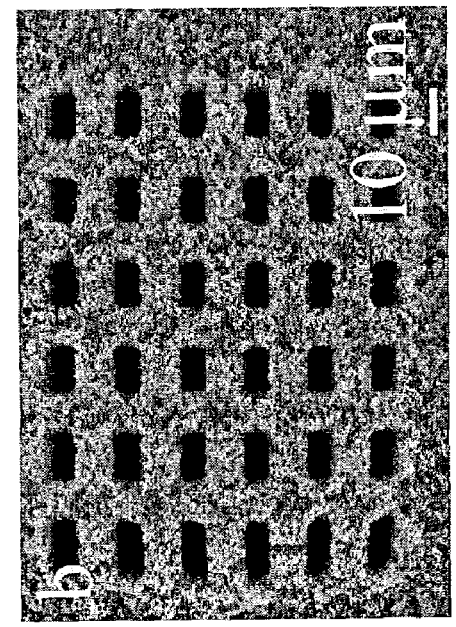

The method and structure of the second preferred embodiment will now be described. In the second preferred embodiment, porous carbon nanotube films were fabricated. These porous films were fabricated with a high degree of control over pore sizes, shapes and separations. This is illustrated in FIGS. 3A–C, which show nanotube films with regular arrays of pores. Three different pore features imprinted in the nanotube film are shown in FIGS. 3A–C. For example, nanotube films with square and rectangular pores arranged in a rectangular grid are shown in FIGS. 3A and 3B, respectively. A nanotube film with randomly shaped pores arranged in a random orientation is shown in FIG. 3C. The porous carbon nanotube films shown in FIGS. 3A–C include a plurality of carbon nanotubes aligned lengthwise in a direction away from the template layer and a plurality of first pores extending through the film in the same direction. The bottom ends of the carbon nanotubes are attached to the porous template material such that the pores in the nanotube film have a controlled size and are aligned with the respective pores in the template material. The carbon nanotubes are not disposed on portions of the substrate exposed through the pores.

The porous nanotube films were obtained by using a porous template structure or layer formed over a substrate. For example, a porous silica template layer was obtained by forming a silica layer on the silicon substrate and then photolithographically masking the layer and etching pores or holes in this layer. Since the pores or holes are formed by photolithography and etching, they have a controlled size. The pores or holes extend down to the silicon substrate and may extend into the silicon substrate if desired. Thus, portions of the substrate are exposed through pores in the porous template layer. Nanotube-forming gases or mixtures were provided onto the porous template layer and the carbon nanotubes were selectively grown on the porous template layer. However, the nanotubes were not formed on portions of the substrate exposed through pores in the porous template layer. Furthermore, the nanotubes did not form on the template layer pore sidewalls because the template layer thickness is not sufficient to allow nanotube growth on side surfaces of the pores in the template layer. For example, the template layer may have a thickness of less than about 200 nm, depending on the exact processing conditions and the template material used, to avoid nanotube growth on the side surfaces of the pores. If desired, after the nanotube film is grown, the substrate may be selectively removed, such as by polishing or by silicon selective etching, to form a free standing porous nanotube film. In an alternative aspect of the second embodiment, the porous nanotube film is produced by a different method. The template material can be selectively covered by noncatalytic masking materials (e.g., gold) through lithography and deposition, at locations where pores are desired. The template material has a plurality of first regions masked by a masking material which does not catalyze nanotubes, such as gold or copper masking material. The ends of the nanotubes are attached to the template material such that the plurality of pores in the nanotube film have a controlled size and are aligned with the plurality of first regions on the template material masked by the masking material. When the nanotubes are grown on the masked template material, the nanotubes selectively grow on the exposed template material but not on the masked first regions of the template material.

Thus, the template layer may be considered to be the negative pattern of the one used to make free-standing nanotube blocks shown in FIGS. 1 and 2. Both the number of nanotubes in each block (e.g., pillar), and the lateral separation between the blocks or pores are limited only by the smallest dimension of silica patterns that can be produced, and these can conceivably be made smaller by using electron-beam lithographed templates or templates made by other submicron lithography or patterning methods.

The method and structure of the third preferred embodiment will now be described. In the third embodiment, selective nanotube growth on the template structure having at least one, and preferably two or more surfaces. The nanotube growth occurs in a direction normal to the respective surfaces and hence this approach can be harnessed to simultaneously grow nanotubes in several predetermined directions. For example, nanotube growth in mutually orthogonal directions may be carried out by using template structures comprising of deep etched trenches, drilled all the way to silicon substrate, separating several thick $SiO_2$ template structure towers. Preferably, the nanotubes are grown on side surfaces of the template structures, which are preferably thicker than about 200 nm, preferably thicker than 2 microns. For example, the template structure may be several microns thick, such as 2 to 10 microns thick, preferably 5 to 8.5 microns thick. However, thickness of the template structure for growing controllably aligned nanotubes on the side surfaces of the template structure varies based on the template material and the nanotube growth conditions. The preference of nanotubes to grow normal to, and selectively on, silica surfaces, forces the nanotubes to inherit the topography of the substrate templates, enabling the premeditation of both nucleation sites and growth direction.

Preferably, the template structure that is located on the substrate has at least one, and preferably two or more surfaces. A first plurality of carbon nanotubes are disposed on a first surface of the template structure. These first plurality of carbon nanotubes are controllably aligned in a first direction perpendicular to the first surface of the template structure. Furthermore, a second plurality of carbon nanotubes are disposed on a second surface of the template structure. This second plurality of carbon nanotubes are controllably aligned in a second direction perpendicular to the second surface of the template structure, such that the first direction is different than the second direction. The same applies for other surfaces of the template structures.

Figure 4B:
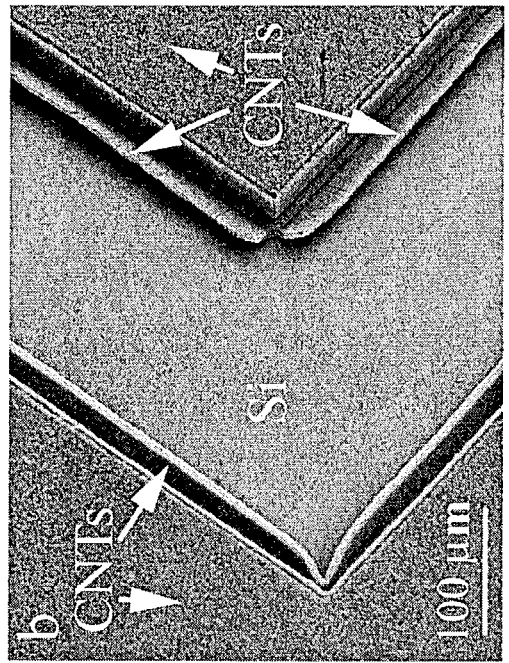
Figure 4A:
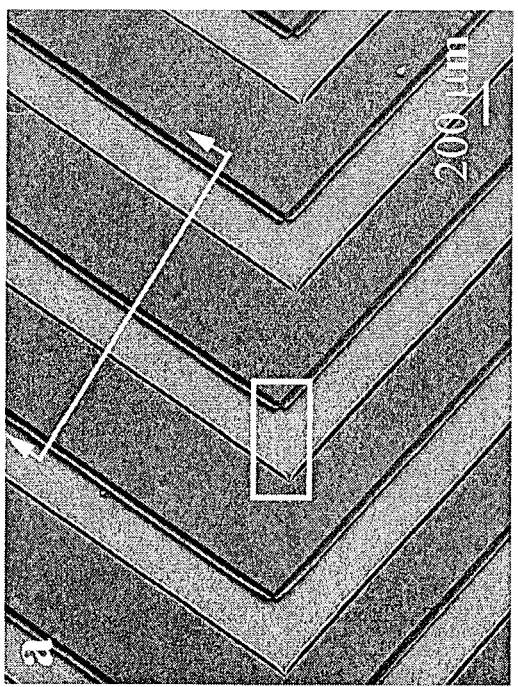
Figure 4D:
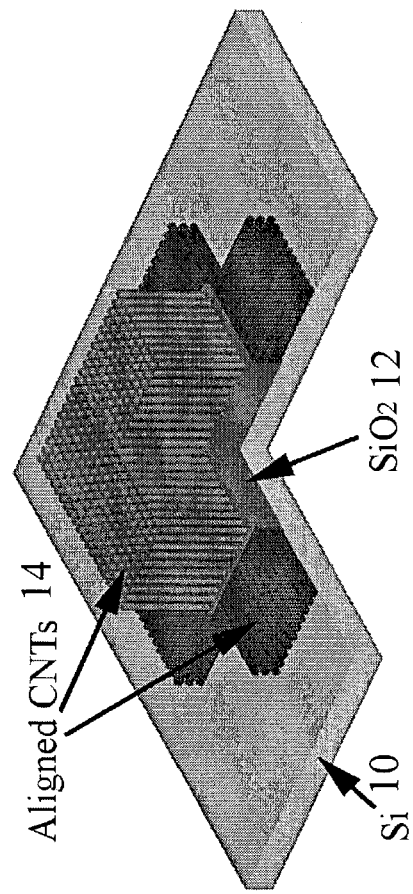
Figure 4C:
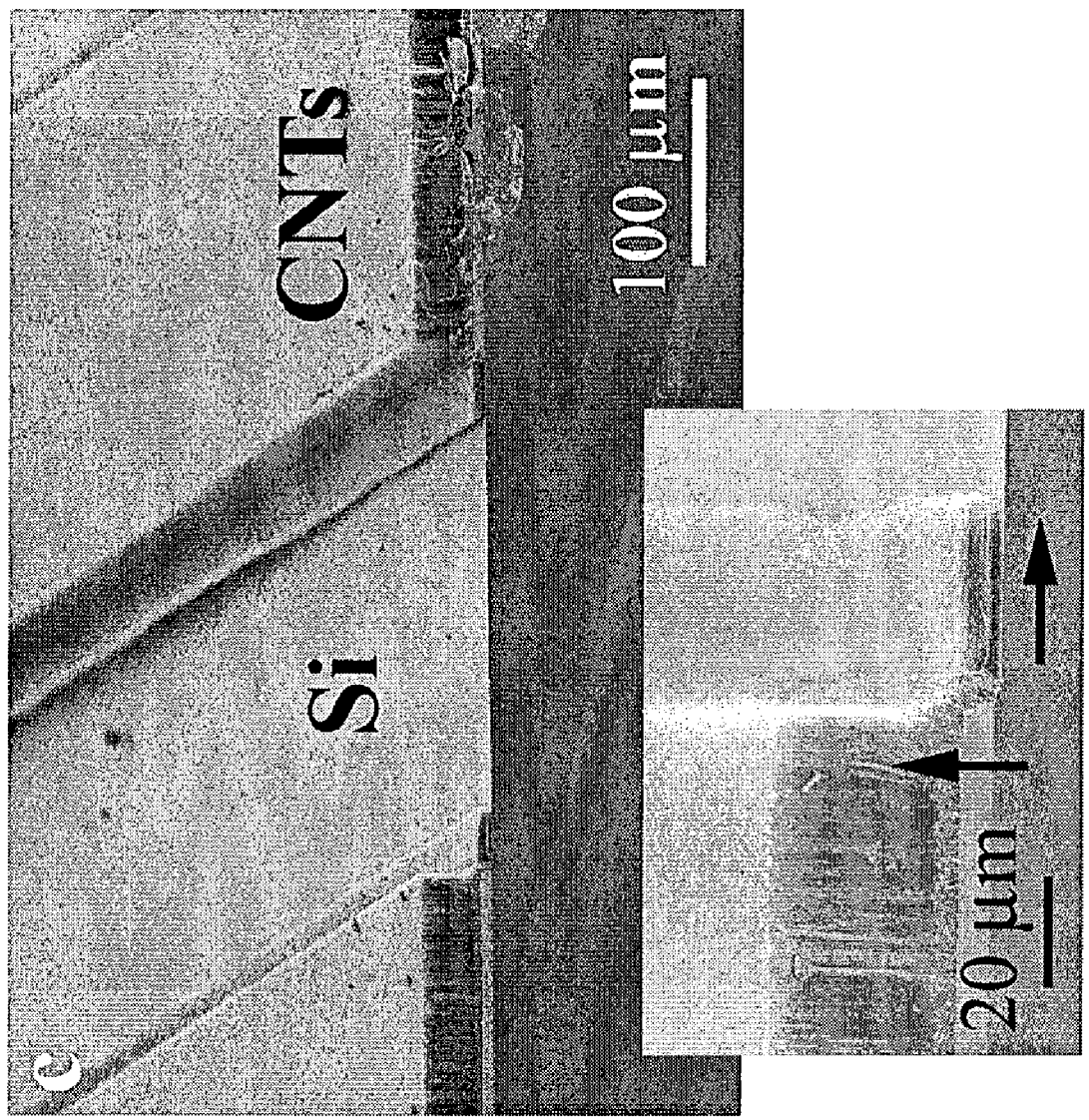

FIGS. 4A–D illustrate vertically and horizontally aligned nanotube arrays adjacent to each other produced in a single-step growth process. FIG. 4A is an SEM image of simultaneously vertically and horizontally aligned nanotube arrays of nanotubes grown on a template structure comprising a thick $SiO_2$ film with deep, etched trenches that separate alternating layers of $SiO_2$ and silicon. FIG. 4B is an enlarged area marked by the white box in FIG. 4A. FIG. 4B illustrates three dimensional aligned vertical and horizontal growth of nanotubes. The length of nanotubes in both vertical and horizontal growth is about 60 microns. The thickness of $SiO_2$ patterns was 8.5 microns, which is thicker than a threshold required to grow controllably aligned nanotubes on side surfaces. FIG. 4C shows a cross-section of the specimen of FIG. 4A cut along the white line shown in FIG. 4A. The inset in FIG. 4C is a higher magnification image that shows the perfect, controlled orthogonal alignment of the nanotube arrays.

FIG. 4D is a schematic illustration of the SEM images of FIGS. 4A–C. The rectangular silica template structure 12 is formed on a silicon substrate 10. The controllably aligned nanotube structures or arrays 14 are formed on the upper surface of the template structure 12 as well as in two orthogonal directions in the substrate plane itself (i.e., the nanotubes 14 are aligned parallel to the upper plane or surface of the substrate 10). Thus, the nanotubes 14 on the upper template structure 12 surface are perpendicular to the nanotubes 14 on plurality of side surfaces of the template structure 12, and the nanotubes 14 on different template side surfaces are located in different (i.e., perpendicular) directions from each other. Thus, the nanotubes 14 are controllably aligned in directions perpendicular to the plurality of the side surfaces of the template structure 12.

Figure 5:
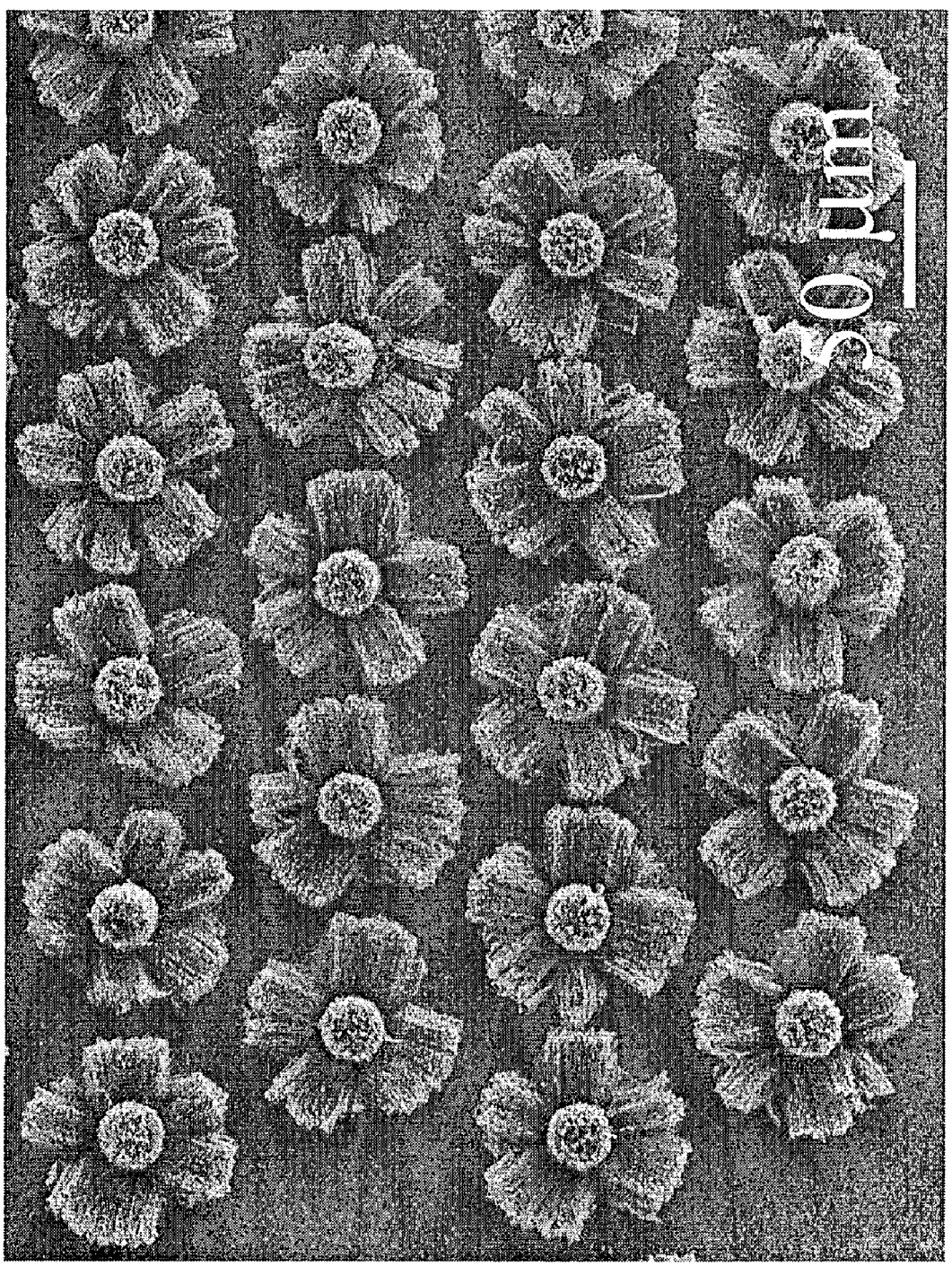

Another preferred aspect of the third embodiment is illustrated in FIG. 5. In this aspect, the template structure 12 shown in FIG. 5 comprises a cylindrical pillar having a height of about 5 microns containing one continuous side surface. The carbon nanotubes are controllably aligned in a direction perpendicular to this side surface of the template structure. The nanotube domains or structures 14 in FIG. 5 includes vertical and horizontal arrays of nanotubes. The short vertical block of nanotubes grown in the center of each pattern is surrounded by radiating nanotube arrays (wings) grown on the side surface of the silica template structure. If wet etching of the thick silica template structure 12 creates inclined side surfaces (forming a frustum rather than a perfect cylinder), then the nanotube wings would not be perfectly horizontal (i.e., parallel to the substrate surface), but still perpendicular to the template surface.

The method and structure of the fourth preferred embodiment will now be described. In the fourth embodiment, the structure contains nanotubes packed with oblique inclinations, neither orthogonal nor planar or parallel with respect to the upper substrate plane, by using deep-trench template structures, such as silica structures, with inclined side surfaces. FIGS. 6A-6G show illustrative examples where nanotubes grow normal to the walls of such circular trenches, resulting in membrane iris-shaped structures having the shapes of open truncated cones.

The term "cone" includes the right circular cone with a circular base or directrix as well as structures having a curved (open or closed curve) or polygonal base or directrix to form pyramidal type structures with irregular or trapezoidal faces extending toward a common vertex. Thus, "cone" includes any structure having a surface generated by a straight line passing though a fixed point and moving along the intersection with a fixed curve.

Figure 6C:
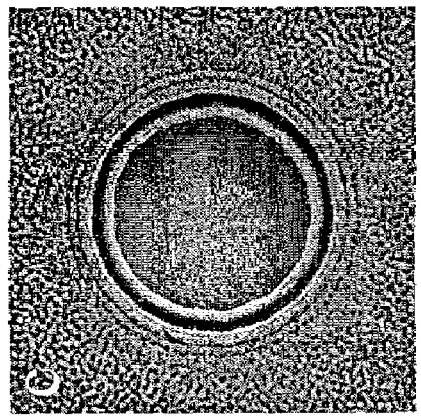
Figure 6F:
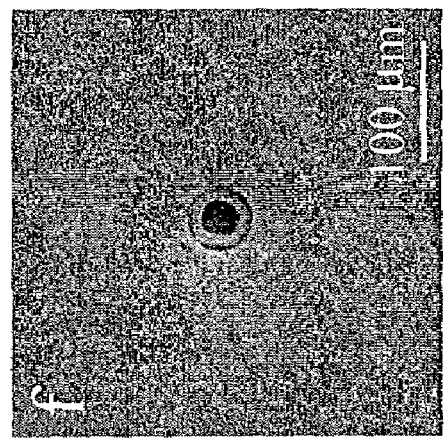
Figure 6B:
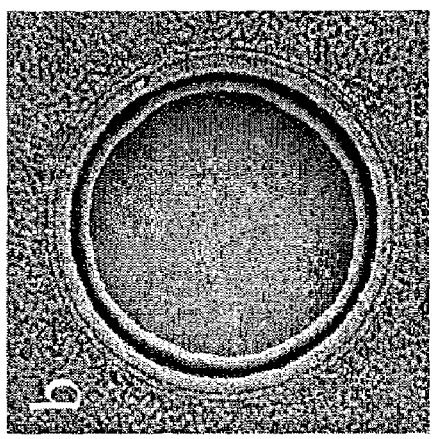
Figure 6E:
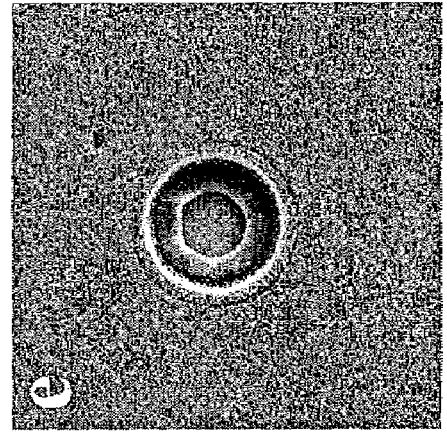
Figure 6A:
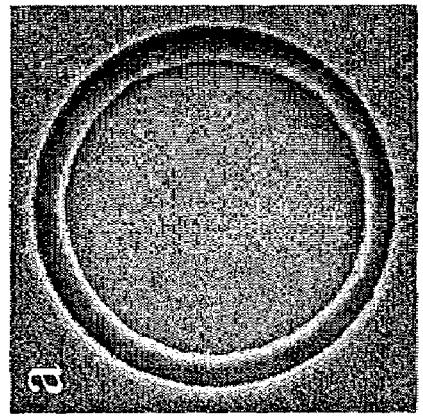
Figure 6D:
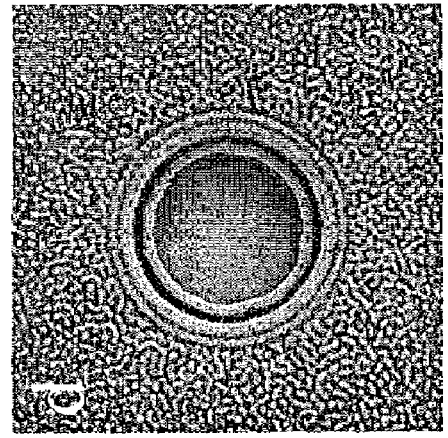
Figure 6H:
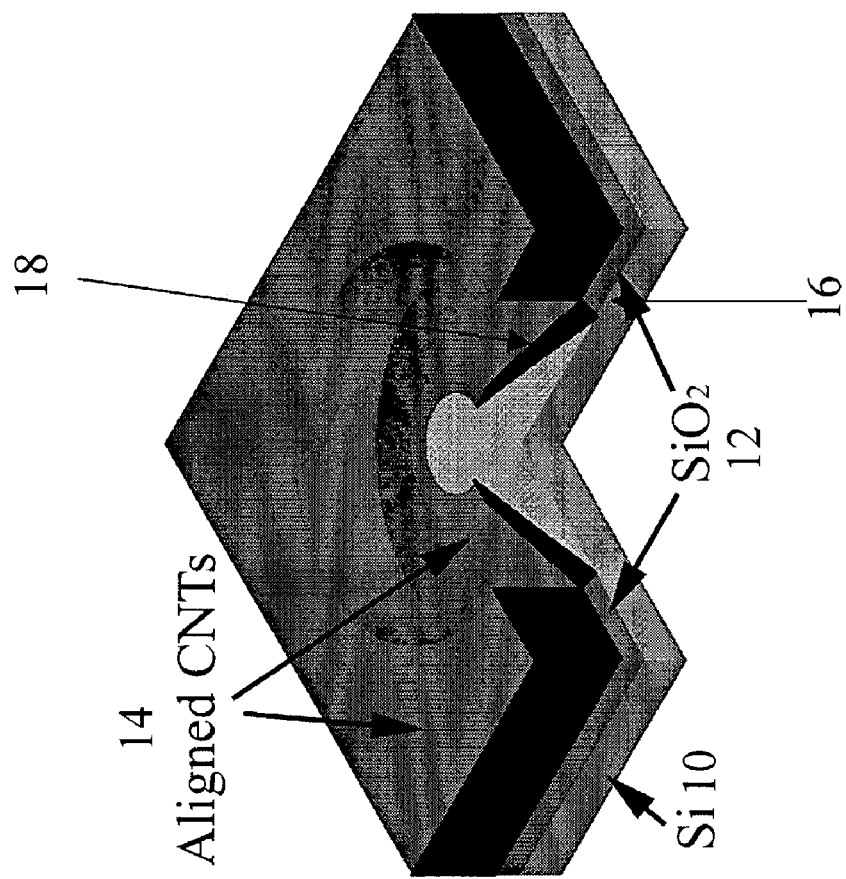

FIG. 6H is a schematic illustration of the cone shaped nanotube structures. The template structure 12 on the substrate 10 contains an inclined side surface 16 and a flat upper surface. The inclined surface 16 has an oblique inclination which is neither orthogonal nor parallel with respect to an upper plane of the substrate 10. The nanotubes 14 on the upper surface grow perpendicular to this surface of the template structure 12. The nanotubes 18 on the inclined side surface 16 of the template structure extend perpendicular to this surface 16 to form the cone shaped membrane.

Figure 6G:
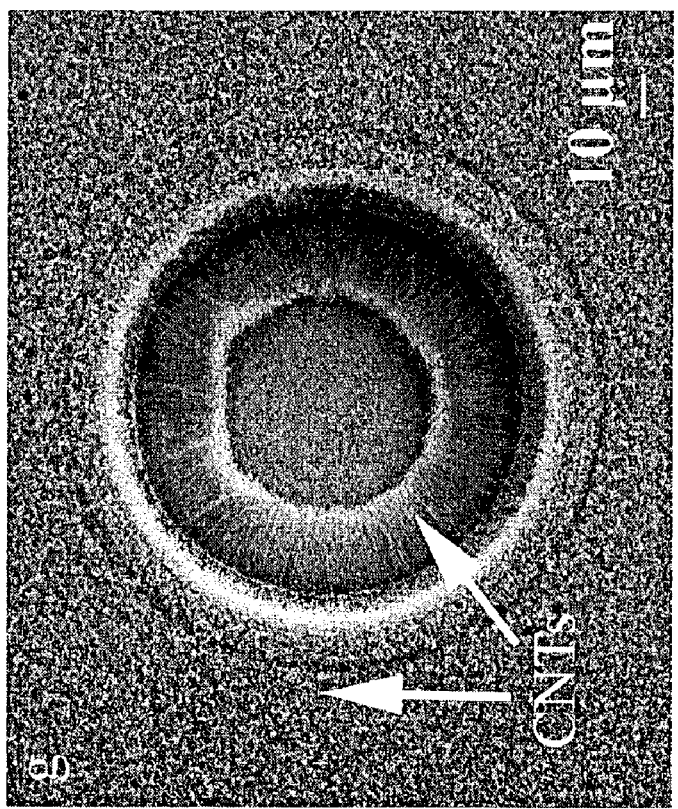

The free standing membrane structures 18 made of aligned nanotubes created in the shapes of open truncated cones may have any desired size. The width of the membrane or the size of the opening can be controlled by the pattern diameter, the angle of trench wall and the time of growth. Typical examples of different diameter, cone angle, size of opening of the nanotube membrane are shown in FIGS. 6A–F. The diameter of the pattern structures are 300, 250, 200, 150, 100 and 50 microns, respectively. FIG. 6G shows an enlarged view of the 100 μm diameter structure in FIG. 6E to demonstrate the geometry of the nanotube membrane in this 3-D architecture.

This cone shaped membrane is formed the same way as the previous nanotube structures. The nanotube source gas is provided onto the template structure 12 and the carbon nanotubes 18 are selectively grown on the inclined surface 16 of the template structure but not on exposed portions of the substrate 10, such that the grown carbon nanotubes comprise a membrane having an open truncated cone shape. The nanotubes 14 may also be grown on the upper surface of the template structure 12 or the upper surface of the template structure may be masked, as will be described below, to form only the nanotube membrane 18 on the template structure 12.

FIGS. 6A–G also show the flexibility of the method of the fourth embodiment to obtain radially oriented nanotubes with the entire spectrum of in-plane orientations relative to the substrate plane. The present inventors produced structures with different diameter, cone angle, size of opening and film thickness by tailoring the pattern dimensions, and growth time to control nanotube length. Similarly, complex shapes of nanotube structures can be generated by altering the trench geometry and depth.

The method and structure of the fifth preferred embodiment will now be described. In the fifth embodiment, a masking layer or material is formed on a portion of the template structure to selectively grow nanotubes only on an exposed portion of the template structure. A masking layer is a layer which inhibits growth of nanotubes on the template structure. For example, a 2 to 20-nm-thick gold layer can be used as a masking material for silica template structures. Other examples of masking materials include polysilicon, copper, or any other material that does not catalyze nanotube growth. The masking material preferably has a thickness at which it forms a continuous layer. Thus, in a preferred aspect of the fifth embodiment, a template structure is located on the substrate. A masking material covers a first portion of the template structure. A plurality of carbon nanotubes are located on a second portion of the template structure not covered by the masking material. The carbon nanotubes are not located on the masking material or on exposed portions of the substrate. Preferably, a plurality of template structures are located on the substrate.

The method of the fifth preferred embodiment includes providing a substrate containing a template structure having at least a portion covered by a masking material and providing a nanotube source gas onto the template structure. The method also includes selectively growing the carbon nanotubes on an exposed portion of the template structure but not on exposed portions of the substrate and not on portions of the template structure covered by the masking material.

The method provides selective growth of nanotube bundles in controlled directions parallel to the substrate surface, by inhibiting nanotube growth from certain template structure portions or surfaces, such as the upper and/or some of the side surfaces. The lengths of CNTs growing in different directions can be tuned by adjusting the masking material coverage and thickness respective template structure surfaces, the deposition time, and the SiO$_2$ pattern spacing. This allows fabrication of arrays of low-electrical resistance nanotube-metal contact structures that could be used to create nanotube-based electrical devices.

Figures 7A, 7B:
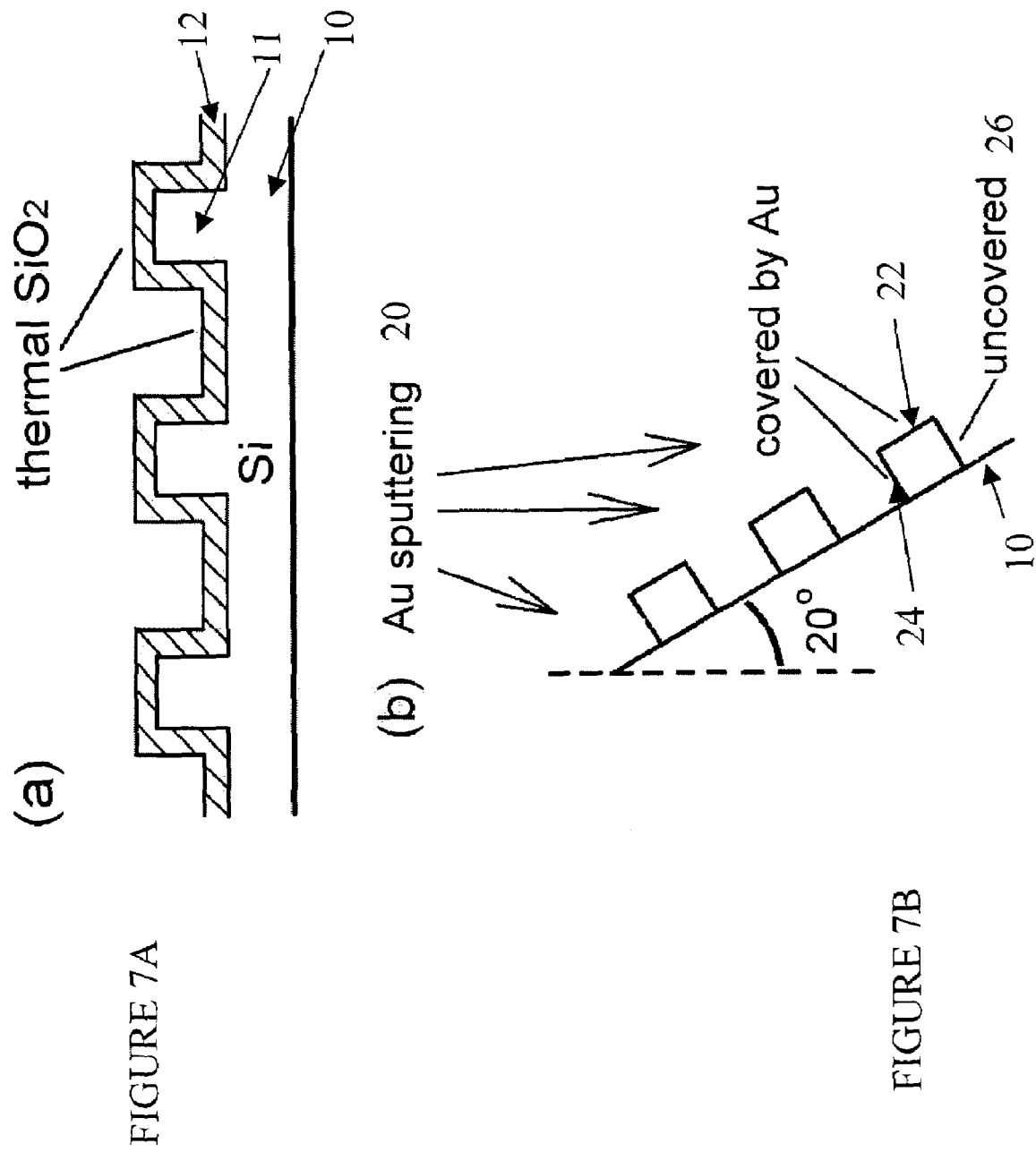
FIGS. 7A–B are side cross sectional schematic views of a method of making carbon nanotube structures according to a preferred embodiment of the present invention.

FIGS. 7A and 7B are schematic illustrations of a method of forming the masking material on the template structures. As shown in FIG. 7A, silicon ridges 11 were photolithographically formed on a silicon substrate 10. The substrate 10 and the ridges 11 were covered with a thermally grown SiO$_2$ layer to form thermally-oxidized SiO$_2$ template structures 12. Other suitable methods to form the template structures may be used if desired. For example, a CVD SiO$_2$ layer may be patterned into template structures, as in the first embodiment.

FIG. 7B illustrates selective deposition of the gold masking layer on some surfaces of the template structure 12. The substrate 10 containing the template structures 12 was placed into a sputtering apparatus containing a sputtering target 20 and was tilted at 15 to 40 degrees, such as at 20 degrees relative to the target 20. A gold masking layer was then selectively sputtered onto the upper surfaces 22 and the left side surfaces 24 of the template structures. The right side surfaces 26 of the template structures were not covered by the masking layer. In the specific example of forming a gold masking layer, a gold layer was sputtered onto SiO$_2$ covered Si substrates in a 50 mTorr Ar plasma at an anode voltage of 7 V and a current of 25 mA, leading to an average deposition rate of about 1 nm s$^{-1}$. Inside the sputter chamber, the substrates with SiO$_2$ patterns were placed in a near-vertical configuration, at a tilt angle of about 20 degrees, with a sample-cathode distance of 30 mm. This sample placement geometry results in Au coverage on the top surface and one sidewall of each SiO$_2$ template structure that faces the Au flux, while the opposite sidewall is protected from Au coverage. Rutherford Backscattering Spectrometry (RBS) measurements carried out using a 2 MeV He$^{++}$ probe beam show that SiO$_2$ surfaces are covered with $1.1 \times 10^{17}$ atoms/cm$^2$ of Au (nominal thickness of about 20 nm) when exposed to the Au sputter-flux for 20 seconds.

Of course, other masking layer fabrication methods may be used instead. For example, the masking layer may be deposited by evaporation, sputtering, CVD or plating on the entire surface of the substrate and the template structures. The masking layer may then be photolithographically patterned to cover only the desired portions of the template structures 12. Alternatively the masking layer can be deposited only at desired locations by using a shadow mask, or through lift-off lithography techniques.

The Au-coated SiO$_2$ template structures were placed into a CVD tube furnace to grow carbon nanotubes selectively on exposed SiO$_2$ surfaces using a xylenes-ferrocene mixture. Substrates without Au coating were also loaded in the CVD furnace. A solution of 0.4 g ferrocene dissolved in 40 ml xylenes was fed into the CVD furnace at temperatures between 600 to 1100° C. for time intervals ranging from 5 to 30 minutes. This method produced aligned nanotubes, which were typically multiwalled nanotubes with diameters of about 20 to 50 nm.

FIGS. 8A–8B illustrate the growth behavior of carbon nanotubes (CNTs) on SiO$_2$ template structures that were not coated with Au before CVD. FIG. 8A illustrates star-like growth of aligned CNTs on a row of SiO$_2$ template structures without Au coverage. The inset shows a schematic sketch of the morphology. FIG. 8B is a high magnification view of FIG. 8A showing the CNT—CNT interface (see arrow) between SiO$_2$ patterns. The nanotubes grow from all five surfaces of these template structure, i.e., the upper surface and four side surfaces, forming a star-like structure. The CNTs in each direction are well aligned, and have the same length of about 25 microns. CNTs growing in opposite directions, towards each other between patterns, cease to grow when they meet each other and form CNT-CNT interfaces as shown in FIG. 8B.

In contrast, FIGS. 8C–F illustrate selective CVD in-plane growth of aligned CNT bundles on exposed portions of template structures whose remaining portions were covered by a masking material. The selective growth is clearly in FIG. 8C, which shows 50 micron long CNT bridges grown from the left sidewalls of SiO$_2$ template structures whose upper and right sidewall surfaces were coated with Au. The CNTs form continuous nanotube bridges across a row of template structures.

The CNTs grow straight, in a direction perpendicular to the silica surface seeding them, until they arrive at the next template structure, as shown in FIG. 8D. The CNT growth terminates abruptly when the nanotube tips reach the Au masking material covered sidewall of the next template structure, which serves as a barrier to further growth. This feature is illustrated in FIG. 8E. FIG. 8E is a close-up view of the rectangular box in FIG. 8D, and shows a sharp interface between CNT tips and the template structure sidewall covered by Au where CNT growth stops. The inset in FIG. 8E is a schematic illustration of the side-view of this interface. Thus, when the masking material is a metal, a metal-nanotube contact structure is formed where the carbon nanotubes contact the metal masking material. Horizontal arrows in FIGS. 8C, D, E and F indicate the CNT growth direction.

The process of selectively coating Au on different SiO$_2$ surfaces can be harnessed to controllably grow CNTs along any sets of in-plane directions. For example, the nanotube growth direction was reversed by coating Au on the upper surface and left sidewall of each template structure, as shown in FIG. 8F, compared to the direction shown in FIG. 8B.

The CNT length is solely controlled by deposition time in the absence of physical obstacles in the growth direction. The CNTs grown from the last template structure in FIG. 8F are about 80 microns long, while those grown between template structures are only 50 microns long, identical to the inter structure distance or spacing. This is a useful attribute in order to simultaneously bridge patterns with different inter-pattern distances by a single CVD process, where the growth time can be chosen to allow CNTs to bridge the longest inter structure gaps. Thus, nanotube bridges may be formed between different template structures in a single step even when a distance or spacing between a first and a second template structure differs from a distance or spacing between a second and a third template structure. The nanotube bridges which connect the first template structure to a second template structure differ in length from those which connect the second template structure to the third template structure. These nanotube bridges extend parallel to a surface of the substrate.

Thus, the nanotube source gas is provided for a sufficient time to allow the carbon nanotubes growing on the exposed portions of a one template structure to contact the masking material covering the covered portion of an adjacent template structure to form a nanotube bridge between these template structures. Furthermore, the nanotube source gas is provided for a sufficient time to simultaneously grow carbon nanotubes of a different length to allow the carbon nanotubes growing on the exposed portions of template structures to contact the masking material covering the covered portions of adjacent template structures. Thus, the growth time is selected to allow the nanotubes to bridge the longest desired structure spacing or distance. Thus, by varying the growth time of nanotubes on an array of differently spaced template structures, only the template structures with the desired maximum inter structure spacing are connected by the bridges.

FIGS. 8B and 8F also show that CNTs grown on the two side-walls of $SiO_2$ patterns indicated by two tilted arrows in FIG. 8F are curled and shorter compared to the straight nanotube bundles between patterns. This result suggests that a lower Au coverage due to line-of-sight Au deposition on these $SiO_2$ surfaces leads to short nanotubes with less alignment.

In order to examine this correlation, the present inventors measured the length of CNTs grown on $SiO_2$ surfaces with different Au coverages. The Au coverages were measured by RBS and varied between 0 and $1.1 \times 10^{17}$ atoms/cm².

Figure 9B:
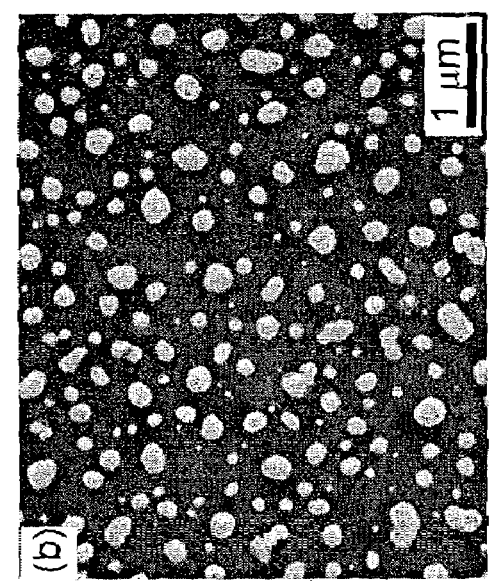
FIG. 9B is an SEM image of gold masking material islands on a surface of a $SiO_2$ template structure according to a preferred embodiment of the present invention.
Figure 9C:
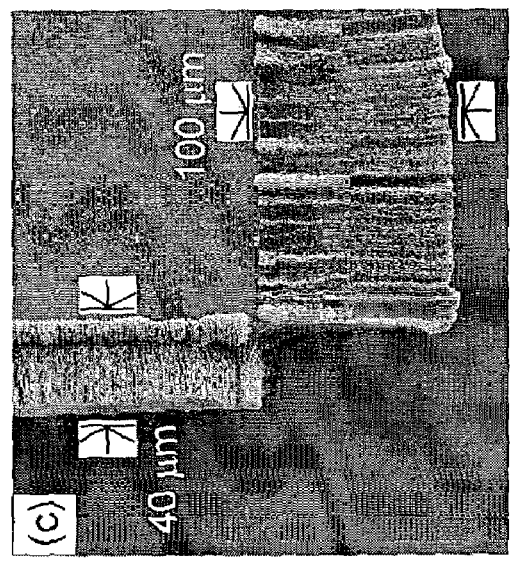
Figure 9A:
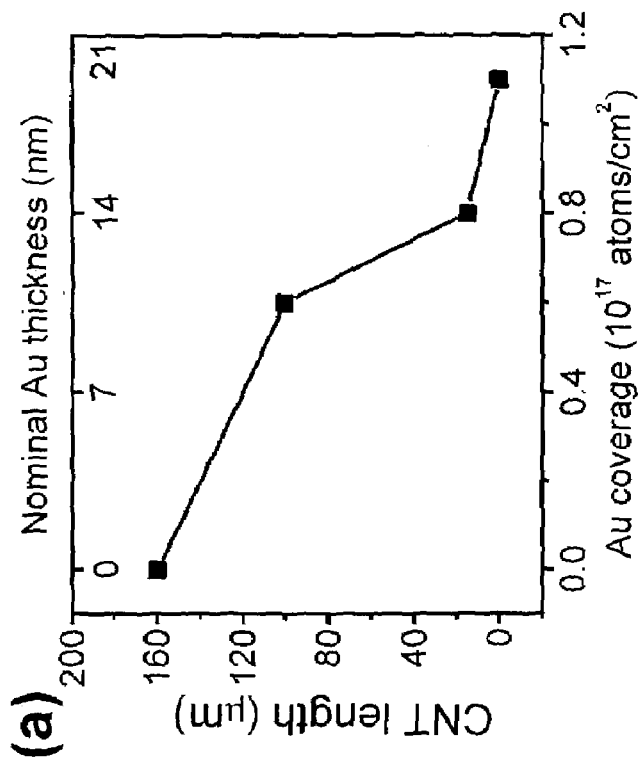
FIG. 9A is a plot of carbon nanotube length as a function of gold masking material coverage on a $SiO_2$ template structure according to a preferred embodiment of the present invention.

FIG. 9A is a plot of CNT length as a function of Au coverage on $SiO_2$. The nominal Au film thickness is also shown on the top axis. For all the cases, CVD conditions were identical and the reaction time was 30 min. FIG. 9B is an SEM image of Au islands (white contrast) on $SiO_2$ surface. FIG. 9C is an SEM image of CNTs grown from the two sidewalls of a template structure with different lengths, 40 microns leftward from a $SiO_2$ surface partially covered by Au and 100 microns downward from a surface not covered by Au during the same deposition step.

The plot in FIG. 9A shows that CNT lengths decrease monotonically with increasing Au-atom coverage, and no nanotube growth is observed for Au coverages above $1.1 \times 10^{17}$ atoms/cm² (nominal Au thickness of about 20 nm). While present inventors do not want to be bound by any particular theory, they propose that the nanotube length decreases with increasing masking layer thickness according to the following mechanism. For Au coverages less than about $1.1 \times 10^{17}$ atoms/cm², the as-deposited Au layer on $SiO_2$ is discontinuous and has an island morphology, as shown in FIG. 9B. It is assumed that the Au islands decrease the intake and interactions of carbon/catalyst flux with $SiO_2$, and alter the nanotube growth rate. At higher coverages, the Au layer is continuous and masks the entire $SiO_2$ surface, thus completely preventing CNT growth. The CNT length-dependence on the Au-coverage is useful for obtaining CNTs of tunable lengths along different directions through control of Au coverage on different faces of $SiO_2$ patterns, as shown in FIG. 9C.

Thus, in a method of a preferred aspect of the fifth embodiment, a first material which facilitates growth of carbon nanotubes, such as a silica or other suitable material layer or structure is provided. At least a portion of the first material is covered with a masking material, such as Au or another material which inhibits CNT growth. A nanotube source gas is provided onto the first material. The carbon nanotubes of a first length are selectively grown on an exposed portion of the first material. If the masking material is thicker than a critical thickness at which it comprises a continuous layer (e.g., Au layer with nominal thickness of greater than about 20 nm), then no CNTs are grown on the masking material. If the masking material is thinner than a critical thickness at which it comprises a continuous layer (i.e., such as an about 20 nm or thinner Au layer), then shorter CNTs of a second length less than the first length are growth on the masking material. Thus, if plurality of different masking materials and/or a plurality of masking material portions of different thickness are formed over the first material, then a plurality of CNTs with different lengths may be grown in the same growth step.

Therefore, by varying the masking material thickness and/or type and/or by varying the spacing the template structure spacing, a plurality of CNTs of different length may be controllably grown during the same deposition step. The growth method includes providing a growth surface which facilitates growth of carbon nanotubes, providing a nanotube source gas onto the growth surface, and controllably growing the carbon nanotubes of different length during the same deposition step.

Figure 10A:
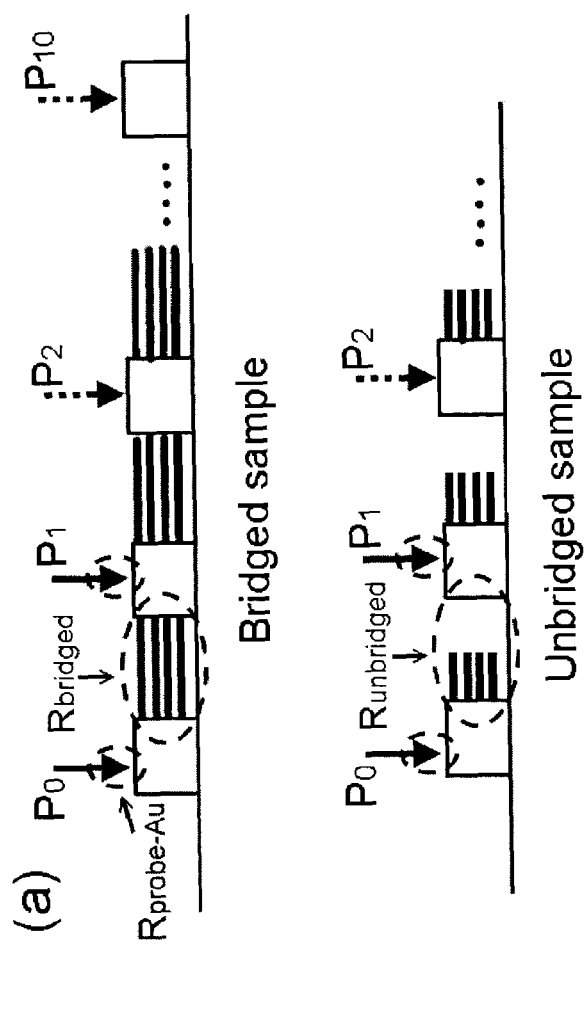
FIG. 10A is side cross sectional schematic view of carbon nanotube structures according to a preferred embodiment of the present invention.
Figure 10B:
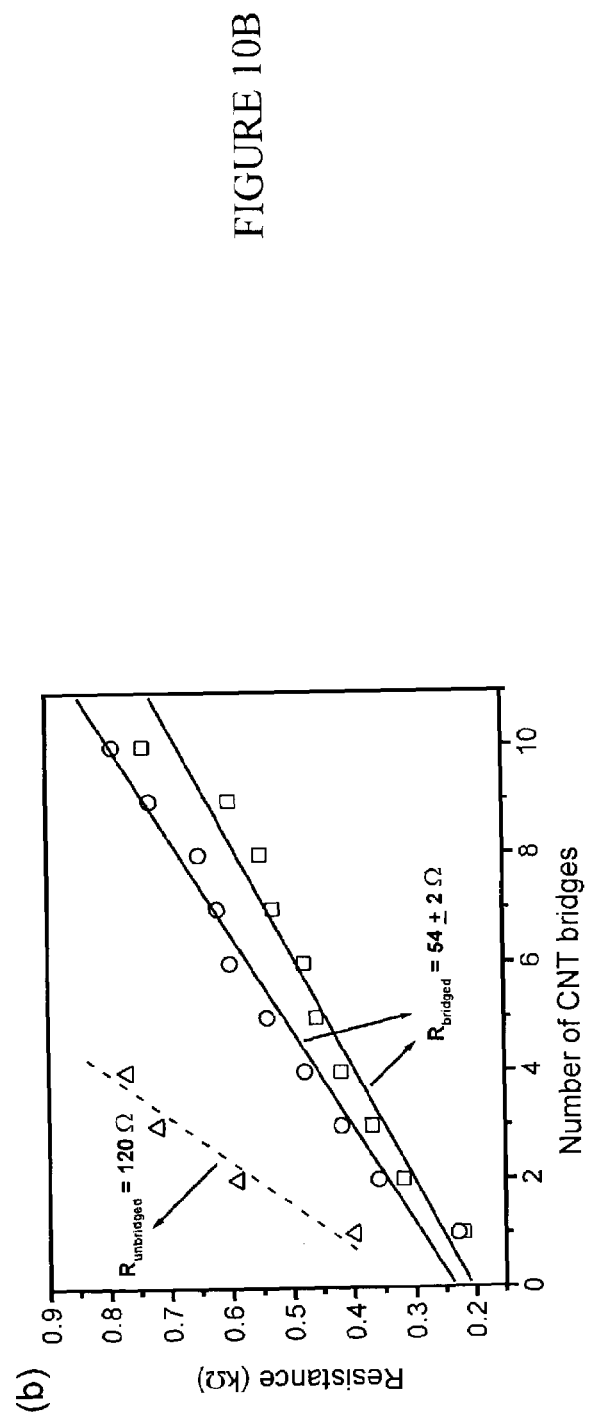
FIG. 10B is a plot of measured resistance versus a number of carbon nanotube bridges according to a preferred embodiment of the present invention.

The present inventors carried out electrical resistance measurements with a two-point probe on Au-coated $SiO_2$ template structures with and without CNT bridges to explore their use in meso-scale circuits. FIG. 10A is a schematic sketch of configuration used to measure the electrical resistance. The unbridged sample was prepared using a short CVD time so that CNTs did not grow long enough to connect adjacent $SiO_2$ template structure. Two bridged samples were also prepared. During the measurements, one probe was fixed at $P_0$, while another probe was moved to different locations from $P_1$ to $P_{10}$, to record the resistances across different number of CNT bridges. FIG. 10B is a plot of resistance as a function of number of CNT bridges. Circles and squares show the resistance behavior for structures with CNT bridges, while triangles show data obtained from unbridged structures. $R_{unbridged}$ is due to the Au layer sputtered on the substrate area between $SiO_2$ patterns.

For all three samples, the resistance increases linearly with the number of patterns. The circuit contact resistance between the probe and the Au layer on top of $SiO_2$ patterns ($=2R_{probe-Au}$), obtained from the ordinate intercept of each plot, is also nearly constant at about 200–300 ohms for all samples. However, the average resistance between two adjacent patterns, denoted by the slope of the plots, is more than a factor of two smaller for patterns bridged by CNTs ($R_{bridged}=54\pm2\Omega$) compared with that of the unbridged patterns ($R_{unbridged}=120\Omega$). This result indicates that the CNT bridges provide a low-resistance electronic transport pathway between the $SiO_2$ patterns. The low resistance of the pattern-CNT-pattern units in the prepared samples is consistent with the good contact between CNT tips and Au layers observed in FIG. 8E, and the well-graphitized multi-walled tube structures.

The fifth preferred embodiment provides in-plane growth of CNTs in predefined directions and with tunable lengths by selective masking of $SiO_2$ template structures with a metal that does not catalyze nanotube growth compared to silica. This method can be used to create nanotube bridges that interconnect $SiO_2$ patterns and provide low-resistance pathways for electrical transport. The methods which combine CVD with topographical masking of patterned substrates may be used for controllably growing nanotube-metal architectures for electronic switching, memory storage, sensing and actuation devices.

The method and structure of the sixth preferred embodiment will now be described. A structure of the sixth preferred embodiment includes at least one suspended template material layer. A first aligned carbon nanotube layer is located on a first surface of the template material layer. A second aligned carbon nanotube layer is located on a second surface of the template material layer, located opposite to the first surface. Thus, a bilayer of aligned carbon nanotubes contains a suspended template layer between them. The nanotubes extend away from the respective surface of the template layer. If desired, three or more layers of aligned carbon nanotubes may be formed on two or more template layers.

The suspended template material layer may be a template material cantilever or membrane supported on a portion of a substrate that does not catalyze carbon nanotube growth. If the template layer has sufficient thickness, then a third aligned carbon nanotube layer is located on an edge surface of the template material layer, such that the third aligned carbon nanotube layer is located perpendicular to the first and the second aligned carbon nanotube layers.

Figure 11A:
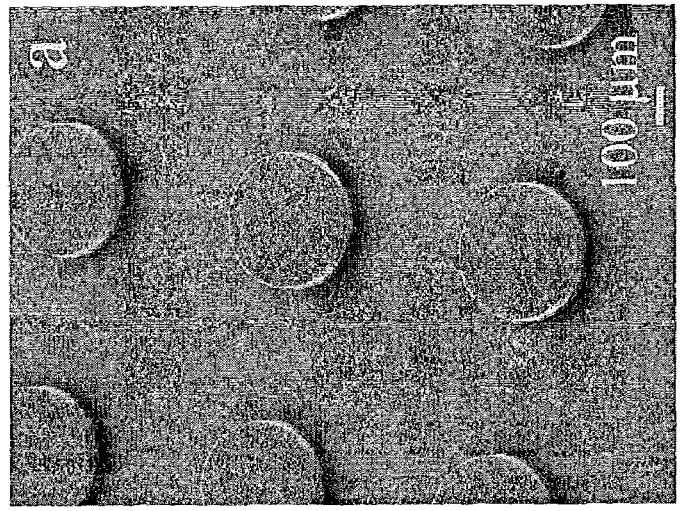

FIG. 11A illustrates a low magnification SEM image showing a bilayer of aligned carbon nanotubes grown at a 180 degree angle with respect to each other (up and down) from the top and bottom surfaces of a suspended, circular $SiO_2$ cantilever layer suspended on a Si base pillar. Any other suitable suspended template material and substrate/base may also be used. If desired, the template layer may comprise a membrane (i.e., a suspended layer supported on two or more sides or on two or more portions of a surface) rather than a cantilever (i.e., a suspended layer supported on one side or on one portion of a surface). The template layer may also contain both edge cantilever portions and a central membrane portion, if desired.

Figure 11B:
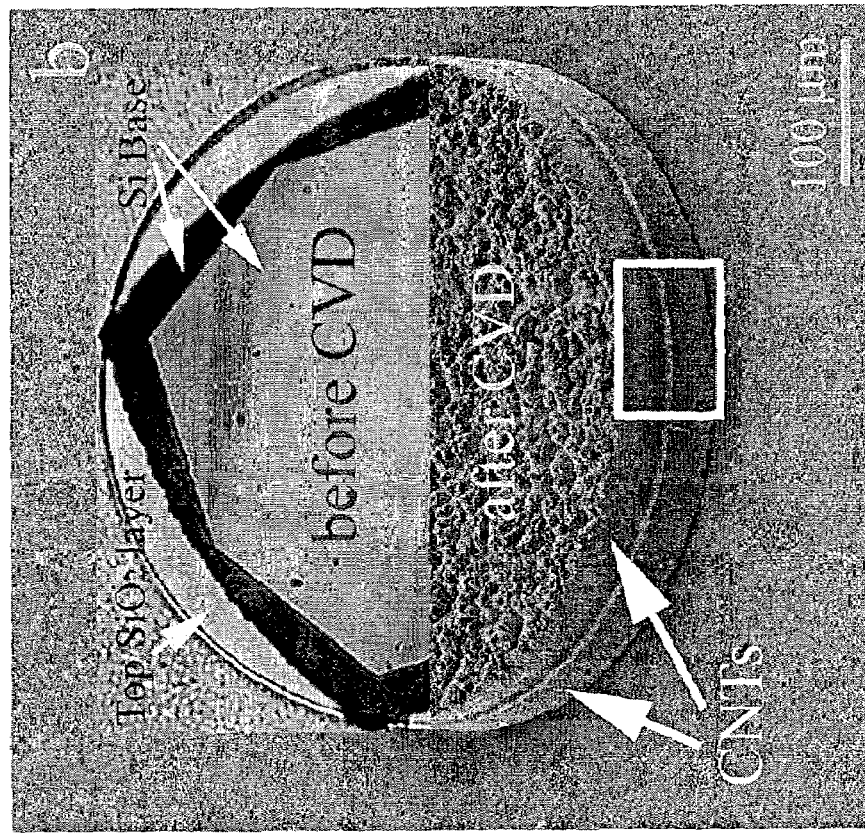
Figure 11C:
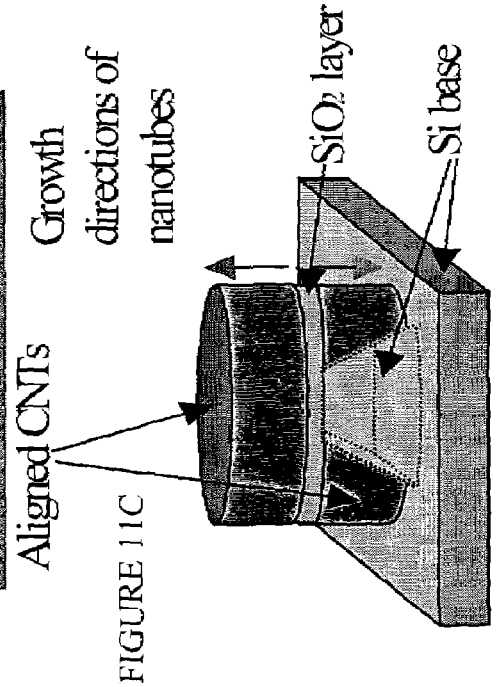

The two growth directions from the $SiO_2$ surfaces (inset) and a schematic illustration of nanotube bilayer growth are shown in FIG. 11B. The $SiO_2$ layer (transparent) is located on the silicon base pillar (opaque), as illustrated in FIGS. 11B and 11C. This pattern of suspended $SiO_2$ templates with two exposed surfaces was generated by undercutting the silica layer located on a silicon substrate into the substrate during deep etching of about 40–50 microns. The template layer in FIGS. 11A–B does not have sufficient thickness to grow nanotubes on its edge surface. The nanotube growth directions are shown by the arrows in FIG. 11C.

Figure 12A:
Figure 12B:
Figure 12C:
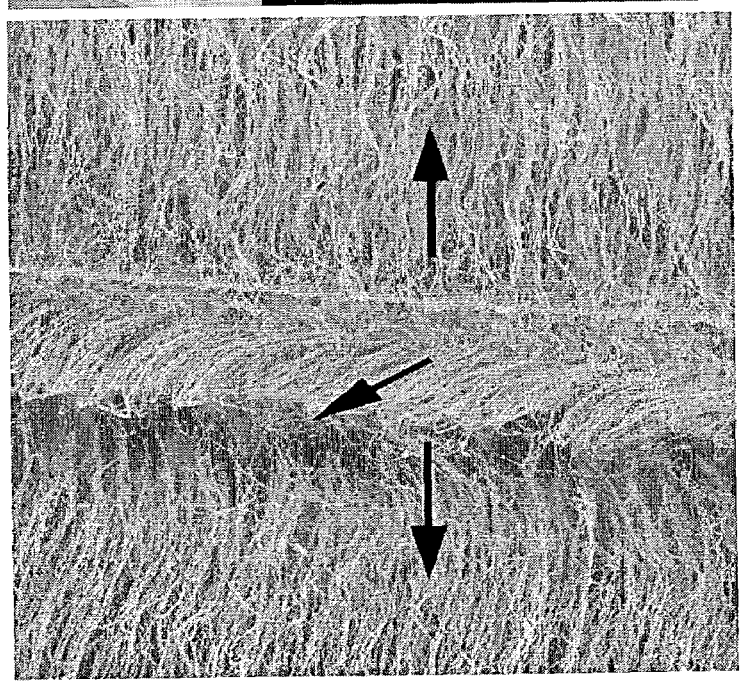

FIGS. 12A–B are schematic sketches showing simultaneous multilayer and multidirectional growth of oriented nanotubes from thick (e.g., 2 microns or more) $SiO_2$ layer suspended on deep etched Si pillars. FIG. 12A is a schematic of a silicon substrate with a thick cantilever $SiO_2$ layer suspended on a Si base before nanotube deposition. FIG. 12B is a schematic of the nanotube growth on the suspended $SiO_2$ layer in three orientations. Since the silica layer is sufficiently thick, a nanotube layer growth from the edge surface of the suspended silica layer. FIG. 12C is an SEM micrograph showing the aligned nanotubes extending in three directions marked by arrows. Thus, as shown in FIGS. 11 and 12, the nanotubes may extend from a suspended template layer toward an upper surface of the substrate at a 90 degree angle. However, the nanotubes may extend towards the substrate at any suitable angle, such as at a 30–160 degree angle, depending on the orientation of the template layer.

Simultaneous multidirectional growth of highly oriented nanotubes with tunable lengths of the preferred embodiments allows formation of complex three dimensional CNT networks, where vertically and horizontally aligned nanotube arrays enable the construction of hierarchical multilevel architectures. Specifically, the nanotube networks may be used in diverse applications such as nanotube-based electronic devices, micro and nano-electromechanical systems, micro- and nano-size porous supports and membranes for catalysis, fluidics and separation, and skeletal reinforcements for composites.

The present inventors have achieved excellent control and flexibility in designing and fabricating a wide variety of carbon nanotube architectures, as discussed in the preferred embodiments. Several ordered nanotube based structural elements of different orientations may be integrated onto one substrate by combining standard lithography techniques with a substrate-selective CNT CVD growth process effected by gas-phase delivery of catalysts. Structures such as micro-fibers and membranes containing highly aligned nanotubes can fabricated and could find use in nanocomposites and electrode systems. The fabrication method described here is far easier and more versatile than the prior art methods. The preferred method does not require a metal catalyst patterning step, thus simplifying the method to a great degree and providing better control, particularly for the catalyst particle size, for the growth process. The preferred method is also scalable over large areas for commercial production with the aid of fabrication techniques commonly used in silicon microfabrication technology.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents.

What is claimed is:

1. A method of making carbon nanotubes, comprising:
   providing a substrate containing a plurality of oxide template structures having at least a portion covered by a masking material;
   providing a nanotube source gas onto the plurality of oxide template structures; and
   selectively growing the carbon nanotubes on an exposed portion of each of the oxide template structures but not on exposed portions of the substrate and not on portions of the oxide template structures covered by the masking material;
   wherein the step of selectively growing the carbon nanotubes comprises simultaneously growing carbon nanotubes of a different length by providing the nanotube source gas for a sufficient time to allow the carbon nanotubes growing on the exposed portion of each oxide template structure to contact the masking material covering the covered portion of an adjacent template structure.

2. The method of claim 1, wherein the step of providing a nanotube source gas comprises providing a nanotube forming precursor gas and a nanotube growth catalyst gas to selectively grow the carbon nanotubes directly on an exposed portion of each of the oxide template structures.

3. The method of claim 1, wherein carbon nanotubes which contact the adjacent template structure are shorter than carbon nanotubes growing from the same template structure which do not contact the adjacent template structure.

4. The method of claim 1, wherein the nanotube source gas is provided for a sufficient time to allow the carbon nanotubes growing on the at least one exposed side surface of a first template structure to contact the masking material of an adjacent second template structure to form a nanotube bridge between the first template structure and the second structure.

5. The method of claim 1, wherein:
   upper surfaces of the template structures are covered by the masking material; and the carbon nanotubes selectively grow on at least one exposed side surface of the template structures parallel to an upper surface of the substrate.

6. The method of claim 1, wherein the masking material comprises polysilicon or a metal which inhibits growth of carbon nanotubes.

7. The method of claim 1, wherein the oxide template structures comprise silicon oxide template structures.

8. The method of claim 7, wherein the silicon oxide template structures comprise silicon dioxide template structures.

9. The method of claim 1, wherein the oxide template structures comprise metal oxide template structures.

10. The method of claim 9, wherein the metal oxide template structures are selected from aluminum oxide, magnesium oxide and indium tin oxide template structures.

11. The method of claim 1, wherein the step of providing a nanotube source gas comprises providing a ferrocene and xylenes containing source gas.

12. The method of claim 1, wherein:
the masking material comprises polysilicon or a metal which inhibits growth of carbon nanotubes; and
the carbon nanotubes are not grown on the masking material.

13. A method of making carbon nanotubes, comprising:
providing a substrate containing an oxide template structure having at least a portion covered by a masking material;
providing a nanotube source gas onto the template structure; and
selectively growing the carbon nanotubes on an exposed portion of the oxide template structure but not on exposed portions of the substrate;
wherein the step of selectively growing the carbon nanotubes comprises simultaneously growing the carbon nanotubes of a first length on an exposed portion of the template structure and growing nanotubes of a second length less than the first length on the masking material.

14. The method of claim 13, wherein:
upper surface of the template structure is covered by the masking material; and
the carbon nanotubes selectively grow on at least one exposed side surface of the template structure parallel to an upper surface of the substrate.

15. The method of claim 13, wherein the step of selectively growing the carbon nanotubes comprises selectively growing the carbon nanotubes on the exposed portion of the template structure but not on exposed portions of the substrate.

16. The method of claim 13, wherein the oxide template structure comprises a silicon oxide template structure.

17. The method of claim 13, wherein the oxide template structure comprises a metal oxide template structure.

18. The method of claim 17, wherein the metal oxide template structure is selected from aluminum oxide, magnesium oxide and indium tin oxide template structure.

19. The method of claim 13, wherein the step of providing a nanotube source gas comprises providing a ferrocene and xylenes containing source gas.

20. The method of claim 13, wherein the masking material comprises a discontinuous layer of a material which inhibits growth of carbon nanotubes.

21. The method of claim 20, wherein the masking material comprises a metal which has a thickness at which it has a discontinuous island morphology.

22. The method of claim 21, further comprising providing additional masking material on which nanotubes do not grow.

23. The method of claim 21, wherein the masking material has a plurality of portions of different thickness such that carbon nanotubes of a plurality of different lengths are grown on the masking material.

24. The method of claim 13, wherein the step of providing a nanotube source gas comprises providing a nanotube forming precursor gas and a nanotube growth catalyst gas to selectively grow the carbon nanotubes directly on an exposed portion of the oxide template structure.

* * * * *